(12) United States Patent  (10) Patent No.: US 9,175,388 B2
Coutu et al.  (45) Date of Patent: Nov. 3, 2015

(54) REACTION CHAMBER WITH REMOVABLE LINER

(75) Inventors: Roger R. Coutu, Hooksett, NH (US); Jill S. Becker, Cambridge, MA (US); Douwe J. Monsma, Amsterdam (NL)

(73) Assignee: Ultratech, Inc., San Jose, CA (US)

( * ) Notice: Subject to any disclaimer, the term of this patent is extended or adjusted under 35 U.S.C. 154(b) by 1185 days.

(21) Appl. No.: 12/609,308

(22) Filed: Oct. 30, 2009

(65) Prior Publication Data

US 2010/0247763 A1  Sep. 30, 2010

Related U.S. Application Data

(60) Provisional application No. 61/197,948, filed on Nov. 1, 2008, provisional application No. 61/208,875, filed on Feb. 27, 2009.

(51) Int. Cl.
*C23C 16/00* (2006.01)
*C23C 16/44* (2006.01)
*C23C 16/455* (2006.01)

(52) U.S. Cl.
CPC ......... *C23C 16/4401* (2013.01); *C23C 16/4407* (2013.01); *C23C 16/4412* (2013.01); *C23C 16/45504* (2013.01); *C23C 16/45582* (2013.01)

(58) Field of Classification Search
USPC .................................. 156/345.37, 916, 914
See application file for complete search history.

(56) References Cited

U.S. PATENT DOCUMENTS

| | | | |
|---|---|---|---|
| 4,294,871 A | 10/1981 | Hieber et al. | |
| 4,907,534 A | 3/1990 | Huang et al. | |
| 4,926,793 A | 5/1990 | Arima et al. | |
| 5,065,698 A * | 11/1991 | Koike | 118/719 |
| 5,082,547 A * | 1/1992 | DeLarge | 204/298.39 |
| 5,366,764 A * | 11/1994 | Sunthankar | 427/248.1 |
| 5,551,982 A * | 9/1996 | Anderson et al. | 118/715 |
| 5,582,866 A | 12/1996 | White | |

(Continued)

OTHER PUBLICATIONS

Beneq, Thin Film System—TFS 500, Nov. 2007.

(Continued)

*Primary Examiner* — Gordon R Baldwin
*Assistant Examiner* — Charlee Bennett
(74) *Attorney, Agent, or Firm* — Allston L. Jones; Peters Verny, LLP

(57) ABSTRACT

A reaction chamber assembly for thin film deposition processes or the like includes an outer wall assembly for enclosing an outer volume and a removable liner installed into the outer volume through an outer aperture for preventing precursors or reactants from coming into contact with internal surfaces of the outer wall assembly and forming thin film layers thereon. The removable liner encloses a reaction chamber and includes substrate support trays or the like for supporting substrates being coated. Thin film layers are formed onto internal surfaces of the removable liner instead of onto surfaces of the outer wall assembly. The removable liner may be disposable or may comprise stainless steel, which can be removed when contaminated, cleaned by abrasive blasting such as bead blasting, and replaced. Two removable liners can be used to periodically swap removable liners and clean one of the liners while the other is in service with minimal disruption to production coating schedules. Other removable cleanable elements such as input and output plenums, door liners and conduits comprising stainless steel can be periodically removed and cleaned by abrasive blasting.

46 Claims, 17 Drawing Sheets

FIRST CHAMBER ASSEMBLY (EXPLODED VIEW)

CHAMBER ASSEMBLY - 1

(56) References Cited

U.S. PATENT DOCUMENTS

| | | | |
|---|---|---|---|
| 5,685,906 A * | 11/1997 | Dietze et al. | 117/101 |
| 5,855,681 A | 1/1999 | Maydan et al. | |
| 5,879,459 A | 3/1999 | Gadgil et al. | |
| 6,015,590 A | 1/2000 | Suntola et al. | |
| 6,080,241 A | 6/2000 | Li et al. | |
| H1888 H * | 10/2000 | Quartarone et al. | 427/318 |
| 6,139,641 A * | 10/2000 | Inokuchi et al. | 118/724 |
| 6,165,271 A * | 12/2000 | Zhao et al. | 118/715 |
| 6,170,429 B1 * | 1/2001 | Schoepp et al. | 118/723 R |
| 6,174,377 B1 | 1/2001 | Doering et al. | |
| 6,194,030 B1 * | 2/2001 | Psaute | 427/248.1 |
| 6,235,634 B1 * | 5/2001 | White et al. | 118/715 |
| 6,258,170 B1 | 7/2001 | Somekh et al. | |
| 6,323,463 B1 * | 11/2001 | Davis et al. | 219/390 |
| 6,342,277 B1 | 1/2002 | Sherman | |
| 6,503,330 B1 | 1/2003 | Sneh et al. | |
| 6,506,352 B1 | 1/2003 | Lindfors et al. | |
| 6,511,539 B1 | 1/2003 | Raaijmakers | |
| 6,572,705 B1 | 6/2003 | Suntola et al. | |
| 6,579,374 B2 | 6/2003 | Bondestam et al. | |
| 6,613,587 B1 * | 9/2003 | Carpenter et al. | 438/4 |
| 6,616,986 B2 | 9/2003 | Sherman | |
| 6,652,924 B2 | 11/2003 | Sherman | |
| 6,730,174 B2 * | 5/2004 | Liu et al. | 118/715 |
| 6,730,367 B2 | 5/2004 | Sandhu | |
| 6,743,475 B2 | 6/2004 | Skarp et al. | |
| 6,764,546 B2 | 7/2004 | Raaijmakers | |
| 6,814,813 B2 | 11/2004 | Dando et al. | |
| 6,869,641 B2 | 3/2005 | Schmitt | |
| 6,884,465 B2 | 4/2005 | Skarp et al. | |
| 6,889,627 B1 * | 5/2005 | Hao | 118/723 R |
| 6,902,624 B2 | 6/2005 | Seidel et al. | |
| 6,911,092 B2 | 6/2005 | Sneh | |
| 7,015,426 B2 | 3/2006 | Doering et al. | |
| 7,020,981 B2 | 4/2006 | Shero et al. | |
| 7,182,816 B2 * | 2/2007 | Kleshock et al. | 118/715 |
| 7,387,686 B2 | 6/2008 | Iwamoto et al. | |
| 7,399,499 B2 | 7/2008 | Basceri | |
| 7,410,671 B2 | 8/2008 | Sherman | |
| 7,431,767 B2 | 10/2008 | Raaijmakers | |
| 2001/0011526 A1 | 8/2001 | Doering et al. | |
| 2002/0041931 A1 | 4/2002 | Suntola et al. | |
| 2002/0073924 A1 | 6/2002 | Chiang et al. | |
| 2003/0024477 A1 | 2/2003 | Okuda et al. | |
| 2003/0165615 A1 | 9/2003 | Aaltonen et al. | |
| 2003/0213560 A1 | 11/2003 | Wang et al. | |
| 2004/0216665 A1 | 11/2004 | Soininen et al. | |
| 2005/0016471 A1 | 1/2005 | Chiang et al. | |
| 2005/0045102 A1 | 3/2005 | Zheng et al. | |
| 2005/0173068 A1 | 8/2005 | Chen et al. | |
| 2005/0188923 A1 | 9/2005 | Cook et al. | |
| 2006/0021573 A1 | 2/2006 | Monsma et al. | |
| 2006/0032586 A1 * | 2/2006 | Choi et al. | 156/345.51 |
| 2006/0051940 A1 * | 3/2006 | Todd et al. | 438/478 |
| 2006/0137608 A1 | 6/2006 | Choi et al. | |
| 2006/0188658 A1 | 8/2006 | Grant | |
| 2006/0196418 A1 | 9/2006 | Lindfors et al. | |
| 2006/0266289 A1 | 11/2006 | Verghese et al. | |
| 2007/0026540 A1 | 2/2007 | van Nooten et al. | |
| 2007/0051312 A1 | 3/2007 | Sneh | |
| 2007/0119370 A1 | 5/2007 | Ma et al. | |
| 2007/0221128 A1 | 9/2007 | Choi et al. | |
| 2007/0231246 A1 * | 10/2007 | Hwang et al. | 423/460 |
| 2007/0264840 A1 | 11/2007 | Itatani et al. | |
| 2007/0295274 A1 | 12/2007 | Webb et al. | |
| 2008/0041307 A1 | 2/2008 | Nguyen et al. | |
| 2008/0063798 A1 | 3/2008 | Kher et al. | |
| 2008/0069955 A1 | 3/2008 | Hong et al. | |
| 2008/0075858 A1 | 3/2008 | Koh | |
| 2008/0081114 A1 | 4/2008 | Johanson et al. | |
| 2008/0107809 A1 | 5/2008 | Wu et al. | |
| 2008/0118663 A1 | 5/2008 | Choi et al. | |
| 2008/0131601 A1 | 6/2008 | Kim et al. | |
| 2008/0138518 A1 | 6/2008 | Suntola et al. | |
| 2009/0035949 A1 | 2/2009 | Niinisto et al. | |
| 2010/0166955 A1 | 7/2010 | Becker et al. | |

OTHER PUBLICATIONS

Cambridge Nanotech, ALD International 2008 Brugge, Belgium, Jun. 29-Jul. 3, 2008.
Cambridge Nanotech, CambridgeNanoTech—Phoenix Production Atomic Layer Deposition System.
Cambridge Nanotech, Tahiti ALD System Proposal for Qualcomm MEMS Technology, Nov. 17, 2008.
Cambridge Nanotech, Tahiti Design Concept and Team, Nov. 17, 2008.
Kostamo et al., Novel Batch ALD Reactor Design for Advanced Microelectronics and Nanotechnology Manufacturing, AVS 8th International Conference on Atomic Layer Deposition, Nov. 20, 2008.
Lindfors et al., Automated Handling of Substrates in an ALD Reactor, AVS 7th International Conference on Atomic Layer Deposition, Sep. 19, 2007.
Picosun, Sunale P-Series ALD Process Tools, Oct. 29, 2008.
Picosun, Sunale R-Series ALD Process Tools, Oct. 29, 2008.
Suntola et al., ALD for advanced semiconductor and nanotechnology manufacturing, Sep. 12, 2007.

* cited by examiner

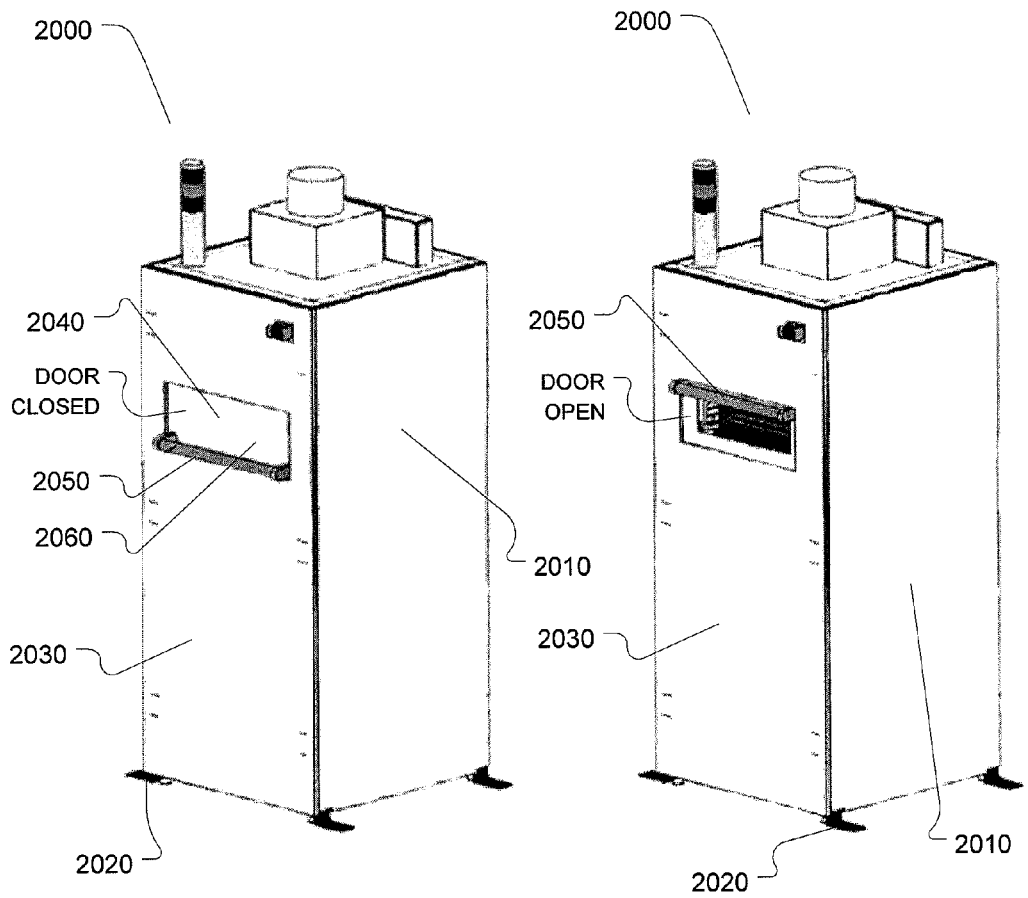

FIRST CHAMBER ASSEMBLY (EXPLODED VIEW)

FIRST CHAMBER ASSEMBLY (ASSEMBLED)

SIDE CUTAWAY VIEW

BACK CUTAWAY VIEW

BOTTOM LINER WALL (TOP VIEW)

DETAIL OF INLET VALVE (SIDE VIEW)

SUBSTRATE TRAY

FLOW DYNAMICS THROUGH OVEN (SIDE VIEW)

DUAL CHAMBER TOWER

CHAMBER ASSEMBLY - 1

CHAMBER ASSEMBLY - 2

CHAMBER ASSEMBLY - 3

WELDED CHAMBER LINER ASSEMBLY

EXPLODED SECTION VIEW

OUTER WALL ASSEMBLY

EXPANDED CHAMBER ASSEMBLY

EXPLODED VIEW OF
EXPANDED CHAMBER ASSEMBLY

REACTION CHAMBER WITH REMOVABLE LINER

1 CROSS REFERENCE TO RELATED U.S. PATENT APPLICATIONS

The present application claims priority under 35 U.S.C. §119(e) to provisional U.S. Patent Application Ser. No. 61/197,948 filed Nov. 1, 2008, and provisional U.S. Patent Application Ser. No. 61/208,875 filed Feb. 27, 2009, both of which are incorporated herein by reference in its entirety and for all purposes.

2 COPYRIGHT NOTICE

A portion of the disclosure of this patent document may contain material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice shall apply to this document: Copyright 2009, Cambridge NanoTech, Inc.

3 BACKGROUND OF THE INVENTION

3.1. Field of the Invention

The present invention relates to a reaction chamber assembly that includes outer walls enclosing an outer volume such as an oven structure and a removable liner enclosing a reaction chamber installed into the outer chamber to substantially contain reactants inside the reaction chamber thereby preventing the outer walls from being contaminated by reactants. The removable liner can be removed from the outer volume when it is contaminated by reactants and replaced. Preferably, the removable liner can be cleaned or decontaminated and reused.

3.2. The Related Art

Reaction chambers such as gas deposition chambers can become contaminated with reactants and or reactant byproducts. This may occur over prolonged use wherein reactants introduced into the reaction chamber react with internal walls thereof and with other elements inside the reaction chamber and build up extensive coating layers or contaminants on the internal walls and the other elements, rendering them unusable. Over time, contaminant build up on the internal walls may begin to crack and peel causing substrate coating failures. Other failures due to contaminant build up include sensor failure, reduced wall and substrate temperatures, or increases in thermal cycling times and concerns for human safety. In production environments, the reaction chamber is typically broken down and cleaned or replaced on a regular maintenance schedule, which may be based on the number of coating cycles performed and which may vary according to the type of reactants being used. While such cleaning occurrences are predictable and can be planned for, they nonetheless disrupt production cycles.

Unscheduled cleaning or maintenance events may occur when a deposition chamber becomes accidently contaminated by a hazardous material and needs to be decontaminated immediately for human safety reasons. In these cases, the cleaning or decontamination is unexpected and may be very disruptive to a production cycle. Accordingly, there is a need in the art for a faster solution for decontaminating a reaction chamber.

Cook et al. in U.S. Pat. Appl. Pub. No. 2005/0188923, suggests that an ex situ cleaning approach can be used to clean a chamber by disassembling the chamber and cleaning the chamber parts by etching them in an acid bath or the like. However, the ex situ method is undesirable because of the excessive time required to disassemble, clean and reassemble the chamber. Cook et al. further suggests an in situ cleaning method wherein an etching gas is pumped into the chamber to etch material layers from internal surfaces of the chamber. However the in situ cleaning method is undesirable because the etch rate is slow, because the etching gas is corrosive and otherwise hazardous, e.g. a hazard to human safety, and because the etching gas may remain in the chamber and contaminate future substrate coating cycles. Cool et al. suggest a third approach for cleaning the chamber, which is to configure one or more removable liners that cover the chamber wall and that the liner may be removed and cleaned or replaced, avoiding extensive cleaning of the other chamber hardware. However, beyond recommending materials for the liner, Cook et al. does not disclose a liner structure of any kind and is completely silent about how the reactants can be contained within the one or more removable liners covering the chamber walls in order prevent the chamber walls from becoming contaminated.

Some reaction chambers are pumped down to a low, medium, or high vacuum pressure (less than 760 torr to about 10 micro torr). The pump down cycle removes air, water vapor, and other gases from the reaction chamber before introducing reactants to ensure that only a desired reactant is present in the chamber during a coating cycle. Additionally, the pump down cycle establishes a chamber vacuum pressure that enhances the desired thin film formation. A pump down or purge cycle is again performed after each reactant has been introduced to remove the reactant from the chamber. Pumping down the chamber provides an added benefit in that it creates a high pressure gradient across the reaction chamber walls and this serves to prevent reactants from leaking through the chamber walls but may cause contaminates to leak through the chamber walls form outside the reaction chamber. When a liner is introduced into the reaction chamber, as suggested by Cook et al., there is no high pressure gradient across that liner wall since the entire chamber, including the liner, is substantially at the same gas pressure. An effective liner needs to contain reactants therein in order to prevent the reactants from contaminating the chamber walls and this containment is made more difficult without the benefit of a high pressure gradient across the liner wall. One solution for preventing corrosive gas from reaching electrical elements housed inside a reaction chamber is disclosed in U.S. Pat. No. 7,015,426 by Doering et al. entitled PURGED HEATER-SUSCEPTOR FOR AN ADL/CVD REACTOR wherein corrosive elements, e.g. conductive wires and the like, disposed inside the gas chamber, are enclosed by a hollow sleeve and a flow of purge gas is continuously passed through the hollow sleeve. The purge gas flowing through the hollow sleeve surrounds the corrosive elements thereby isolating the corrosive elements from the process gasses inside the chamber. The purge gas is allowed to pass from the hollow sleeve into the chamber to mix with the process gas and to be exhausted out of the chamber with the process gasses. While the solution proposed by Doering at al. isolates conductive elements inside the chamber from exposure to process gasses Doering et al. is completely silent about containing reactants inside a removable liner by creating a pressure gradient across the walls of the removable liner by introducing a purge gas flow to surround the removable liner.

More generally, there is a need in the art to increase the size of reaction chambers to handle larger substrates. There is a further need in the art to increase coating throughput by providing reaction chambers suited for batch coating cycles. There is a still further need in the art, to decrease scheduled or unscheduled down time of production oriented reaction chamber systems by providing a reaction chamber that can be easily and quickly decontaminated.

4 LIST OF ITEM REFERENCE NUMBERS

| | |
|---|---|
| 1000 | Dual Chamber Gas Deposition System |
| 1100 | Vent |
| 1110 | Lighting Tower |
| 1120 | Upper Gas Deposition Chamber |
| 1130 | Right Side Face |
| 1135 | Upper Input Gas Supply |
| 1140 | Frame |
| 1145 | Upper Cross Frame Platform |
| 1150 | Lower Gas Deposition Chamber |
| 1155 | Lower Cross Frame Platform |
| 1160 | Lower Input Gas supply |
| 1165 | Electronic Controller |
| 1170 | Lower Load Lock Door |
| 1180 | Front Face |
| 1190 | Upper Load Lock Door |
| 1200 | Single User Interface |
| 2000 | First ALD System |
| 2010 | Floor Standing System Cabinet |
| 2020 | Cabinet Feet |
| 2030 | Cabinet Front Face |
| 2040 | Access Door |
| 2050 | Door Handle |
| 2060 | Outer Door Panel |
| 2070 | Inner Door Panel |
| 2080 | Door Cover |
| 2090 | Door Heater |
| 2100 | Insulation Layer |
| 2110 | Aluminum Plate |
| 2120 | Resistive Heating Element |
| 3000 | Chamber Assembly |
| 3050 | Removable Back panel |
| 3060 | Back Perimeter flange |
| 3070 | Outer Volume |
| 3080 | Movable Access Door |
| 3090 | Support Structure |
| 3100 | Door Actuators |
| 3110 | Heating Elements |
| 3120 | Thermal Insulation Layers |
| 3125 | Reaction Chamber |
| 3130 | Right Rectangular Through Aperture |
| 3140 | Left Rectangular Through Aperture |
| 3150 | Input Plenum |
| 3160 | Input Plenum Flange |
| 3170 | Top Input Plenum Wall |
| 3180 | Bottom Input Plenum Wall |
| 3190 | Input Plenum Side Wall |
| 3200 | Input Plenum Side Wall |
| 3210 | Input Plenum Chamber |
| 3220 | Input Plenum End Wall |
| 3230 | Input Port Assembly |
| 3240 | Gas Supply Module |
| 3250 | Output Plenum |
| 3260 | Output Plenum Flange |
| 3270 | Top Output Plenum Wall |
| 3280 | Bottom Output Plenum Wall |
| 3290 | Output Plenum Side Wall |
| 3300 | Output Plenum Chamber |
| 3310 | Exit Port Assembly |
| 3320 | Exit Port Module |
| 3330 | Stop Valve |
| 3340 | Vacuum Pressure Gauge |
| 3350 | Substrate Support Surface |
| 3360 | Back Panel Eye Bolts |
| 3370 | Cone-Shaped Passage |
| 3380 | Liner Fasteners |
| 3390 | Pin Actuator Assembly |
| 3400 | Lift Post |
| 3410 | Pneumatic Cylinder and Piston Assembly |
| 3420 | Vacuum Bellows |
| 3430 | Circular Through Hole |

-continued

| | |
|---|---|
| 3440 | Guide Rods |
| 3450 | Stiffening Ribs |
| 4000 | First Reaction Chamber Assembly |
| 4010 | Outer Wall Assembly |
| 4020 | Removable Liner |
| 4025 | Front Face |
| 4030 | Input Port Assembly |
| 4040 | Exit Port Assembly |
| 4050 | Top Outer Wall |
| 4060 | Bottom Outer Wall |
| 4070 | Right Side Outer Wall |
| 4080 | Left Side Outer Wall |
| 4090 | Back Outer Wall |
| 4095 | Front Outer Wall |
| 4100 | Outer Aperture |
| 4110 | Outer Volume |
| 4120 | Resistive Heating Elements |
| 4130 | Top Liner Wall |
| 4140 | Bottom Liner Wall |
| 4150 | Right Side Liner Wall |
| 4160 | Left Side Liner Wall |
| 4170 | Back Liner Wall |
| 4180 | Chamber Aperture |
| 4190 | Reaction Chamber |
| 4200 | Rectangular Flange Portion |
| 4205 | Rectangular Recess |
| 4210 | Substrate Tray |
| 4215 | Clearance Gap Volume |
| 4220 | Bottom Substrate Tray |
| 4230 | Tray Supports |
| 4240 | Trap |
| 4250 | Vacuum Valve |
| 4260 | Cone-Shaped Conduit |
| 4270 | Pressure Gauge |
| 4280 | Cylindrical Flange |
| 4290 | Trap Seal |
| 4300 | Attaching Screws |
| 4310 | |
| 4320 | First O-ring Seal |
| 4330 | Second O-ring Seal |
| 4340 | |
| 4350 | Gas Input Port |
| 4360 | Gas Output Port |
| 4370 | Exit Port Assembly |
| 4380 | Tray Bottom Surface |
| 4390 | Stop Pins |
| 4400 | Tray Top Surface |
| 4500 | Exit Port |
| 6000 | Removable Liner |
| 6010 | Liner Base Wall |
| 6020 | Liner Top Wall |
| 6030 | Chamber Aperture |
| 6040 | Liner Back Wall |
| 6050 | Right Liner Aperture |
| 6060 | Left Liner Aperture |
| 6070 | Liner Lifting Handle |
| 6080 | Tooling Ball |
| 6090 | Liner Back Aperture |
| 7000 | Substrate |
| 7010 | |
| 7015 | Input Plenum Liner |
| 7020 | Top Plenum Liner Wall |
| 7030 | Bottom Plenum Liner Wall |
| 7040 | Rectangular Fluid Conduit |
| 7050 | Input Plenum Liner Flange |
| 7060 | Bottom Plenum Liner Wall Top Surface |
| 7070 | (not used) |
| 7080 | Output Plenum Liner |
| 7090 | Upper Volume |
| 7100 | Lower Volume |
| 7110 | Pin Hole (Through Hole) |
| 7120 | Lift Pin |
| 7130 | Movable Pin Plate |
| D | Pin Height Dimension |
| 8000 | Outer Wall Assembly |
| 8010 | Outer Aperture |
| 8020 | Second Outer Aperture |
| 8030 | Right Side Wall |
| 8040 | Left Side Wall |

-continued

| | |
|---|---|
| 8050 | Top Wall |
| 8060 | Bottom Wall |
| 8100 | Third Reaction Chamber |
| 8110 | Removable Liner |
| 8120 | Substrate Tray |
| 8130 | Tray supports |
| 8140 | Reaction Chamber |
| 8150 | Overhanging (Substrate) Edge |
| 8160 | Input plenum |
| 8170 | Exit Plenum |
| 8180 | Outer wall assembly |
| 8190 | Heating element |
| 8200 | Electrical Connector |
| 9005 | Gas Fittings |
| 9010 | Input Port |
| 9015 | Outer Tube |
| 9020 | |
| 9030 | Input Port Flange |
| 9040 | Screws |
| 9050 | |
| 9060 | Precursor Tube |
| 9070 | Annular Flange |
| 9080 | Front Edge |
| 10030 | |
| 10040 | Triangular Input Plenum |
| 10050 | Trapezoidal Exit Plenum |
| 10060 | Upper Wall Portion |
| 10070 | Lower Wall Portion |
| 10080 | Lower Wall Portion |
| 10090 | Triangular Vertical Wall |
| 10100 | Trapezoidal Vertical Wall |
| 10110 | Front Vertical Flow Channel |
| 10120 | Back Vertical Flow Channel |

5 SUMMARY OF THE INVENTION

The present invention provides various reaction chamber assembly embodiments for coating large rectangular substrates in single or batch mode by ALD, ALD and other thin film deposition methods and each embodiment includes removable liner and other removable elements configured and positioned to prevent reactants or precursors from contaminating internal walls of an outer chamber. Preferably the removable liner and other elements are cleanable for reuse.

The reaction chamber assembly includes an outer wall assembly for enclosing an outer volume. The outer wall assembly preferably comprises an oven chamber with heaters disposed to heat the outer volume. The outer wall assembly preferably forms a gas tight outer volume and preferably comprises metal outer walls but any material that meets the structural requirements and can be used over the full range of operating temperatures, such as ceramics is suitable. The preferred material for the outer walls is 6000 series aluminum because it meets the structural and temperature requirements of the outer wall assembly and it also provide excellent thermal conductivity, which is desirable to conduct thermal energy from the heaters into the outer volume. At least one outer wall includes an outer aperture passing through to the outer volume.

A removable liner is installed into the outer volume through the outer aperture and the removable liner is formed to enclose a reaction chamber. The removable liner includes liner walls surrounding the reaction chamber and a chamber aperture passes through one of the liner walls to the reaction chamber and the chamber aperture is co-aligned with outer aperture so that substrates being coated can be installed into the reaction chamber through the outer aperture and the chamber aperture. The liner walls in cooperation with an access door are configured to substantially contain reactants, precursors and other gases delivered into the reaction chamber inside the reaction chamber. In other embodiments the outer walls may include two outer apertures with a front outer aperture being co-aligned with a chamber aperture of the removable liner for installing substrates into the reaction chamber through a front wall and a back outer aperture being used to install the removable liner into the outer volume.

The liner walls are formed from a material that permit reactants deposited thereon as thin film layers to be removed by a cleaning process. The preferred cleaning process is a mechanical bead blast and the preferred material is 300 series stainless steel, however other material having a Brinell Hardness of greater than HB 150 may be used. Alternately, the liner may be chemically cleaned and other wall materials may be suitable. The removable liner may be formed as a unitary structure by various forming methods. The removable liner includes surfaces that are in mating contact with the outer walls to provide thermally conductive pathways from the outer walls to the liner walls to more efficiently and quickly heat the removable liner, the reaction chamber, substrate support surfaces and substrates. In addition, a clearance gap volume is provided between outside surfaces of the removable liner and inside surfaces of the outer walls and a flow of inert gas is delivered into the clearance gap through an input port to maintain a pressure gradient between the clearance gap and the reaction chamber. Excessive pressure in the clearance gap volume may also be vented by a relieve valve or the like in fluidic communication with the clearance gap volume. Alternately, the clearance gap volume may be in fluidic communication with a vacuum pump for removing gases therefrom and for maintaining the clearance gap volume at a vacuum pressure while still providing a positive pressure gradient with respect to the reaction chamber.

One or more substrate support trays are disposed horizontally in the reaction chamber and supported with respect to one or more removable liner walls. When a plurality of tray are used they are stacked one above another with an open volume provided between the trays for source gases to flow through and one or more substrate are supported horizontally on each tray with a surface to be coated facing vertically up. Preferably, each tray is sized to receive a particular rectangular size substrate thereon so that a batch of identical substrates can be coated during each coating cycle. The range of standard rectangular substrate sizes ranges from GEN 1 (300×400 mm) through the GEN 7 substrate dimension standards (2160×2460 mm) and reaction chamber assemblies according to the present invention may be sized according to the desired substrate size. Of course any other substrate type including non-standard rectangular sizes and three dimensional objects that can be fit into the reaction chamber can be coated as required.

An access door is movably disposed with respect to the reaction chamber assembly for providing access to the reaction chamber through the chamber aperture and an outer aperture when the access door is in an open position and for closing and gas sealing the chamber aperture and outer aperture when the access door is in a closed position. The access door includes a removable inner door liner positioned to substantially contain reactants inside the reaction chamber and formed from a material that permit reactants deposited as thin film layers onto the inner door liner to be removed by a cleaning process. Thus the inner door liner comprises 300 series stainless steel or another material with a Brinell Hardness of HB 150 or higher. In addition the access door may include heating elements disposed to heat the reaction chamber through the inner door panel.

An input plenum disposed between reactant gas sources and the reaction chamber includes input plenum walls formed to for enclosing an input plenum volume or conduit that include an input port passing through one of the input plenum walls. The input plenum is shaped to allow gas entering into the input plenum volume to expand over the full transverse width of the reaction chamber before the gas enters into the reaction chamber or at least before the gas begins to flow over any substrates supported inside the reaction chamber. In one example the input plenum is integrally formed with the removable liner and is specifically formed with or by a bottom liner wall and delivers input gases into a vertical flow conduit at a front area of the reaction chamber that extend over the entire width of the reaction chamber. In another example, the input plenum is supported outside the reaction chamber and delivers gas flow into the reaction chamber through an aperture extending through an outer wall and a liner wall and the aperture extands of the entire longitudinal length or transverse width of the reaction or of substrates being coated in the reaction chamber.

An exit plenum is disposed between a vacuum pump and the reaction chamber for drawing outflow out of the reaction chamber. The exit plenum includes walls for enclosing an exit plenum volume or conduit and an exit port passes through one of the exit plenum walls. The exit plenum volume is shaped to allow gas to be drawn into the exit plenum volume substantially over the entire longitudinal length or transverse width of the reaction and or of the substrates being coated. The exit plenum is also formed to reduce a volume of the gas being drawn into the exit plenum before the gas enters into the exit port. One or mores traps are disposed between the exit plenum and the vacuum pump to remove undesirable materials from the outflow. In one embodiment, the exit plenum is integrally formed with the removable liner. In another embodiment, the exit plenum is external to the reaction chamber. In either case the exit plenum forms and exit plenum aperture that extends over the longitudinal length or transverse width of the reaction chamber or a substrates being coated. Preferably both of the external input and exit plenums comprise stainless steel with internal surfaces roughened by bead blasting so that the input and output plenums can be cleaned by mechanical cleaning methods.

The invention also includes a method for operating a reaction chamber assembly. The steps include installing a first removable liners into an outer chamber of the reaction chamber assembly through an outer aperture, coating substrates supported inside the first removable liner with thin film layers that also coat internal surfaces of the first removable liner and replacing the first removable liner with a second removable liner when the internal surfaces of the first removable liner become undesirably contaminated by the thin film layers. The method also includes gas sealing each of the outer chamber and the removable liner by moving the access door to the closed position. The method further includes delivering a purge gas into a clearance gap volume formed between the removable liner and the outer volume. In addition some surfaces of the removable liner and the outer walls are in mating contact for conducting thermal energy from the outer wall assembly to the removable liner installed in the outer volume.

The method also includes cleaning the first removable liner to remove the thin film layers and then replacing the second removable liner with the first cleaned removable liner by abrasive blasting when internal surfaces of the second removable liner become undesirably contaminated and repeating the removing, cleaning and replacing steps.

These and other aspects and advantages will become apparent when the Description below is read in conjunction with the accompanying Drawings.

6 BRIEF DESCRIPTION OF THE DRAWINGS

The features of the present invention will best be understood from a detailed description of the invention and a preferred embodiment thereof selected for the purposes of illustration and shown in the accompanying drawings in which:

FIG. 1 depicts an isometric view of a first exemplary improved ALD system configured with a chamber housed within a system cabinet and with a chamber door shown in a closed position according to one aspect of the present invention.

FIG. 2 depicts an isometric view of an improved ALD system configured with a chamber housed within a system cabinet and with a chamber door shown in an open position according to one aspect of the present invention.

7 DESCRIPTION OF THE PREFERRED EMBODIMENTS

ALD System First Embodiment

Figure 3:
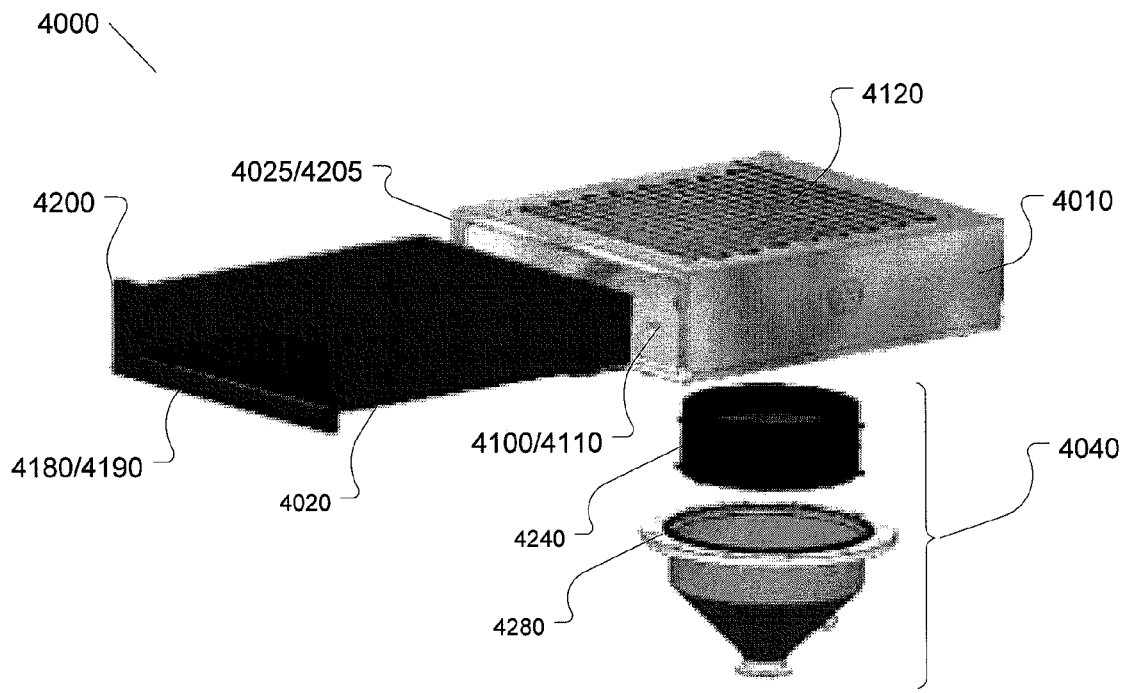
FIG. 3 depicts an exploded isometric view of an ALD reaction chamber configured with a removable liner according to an embodiment of the present invention.
Figure 4:
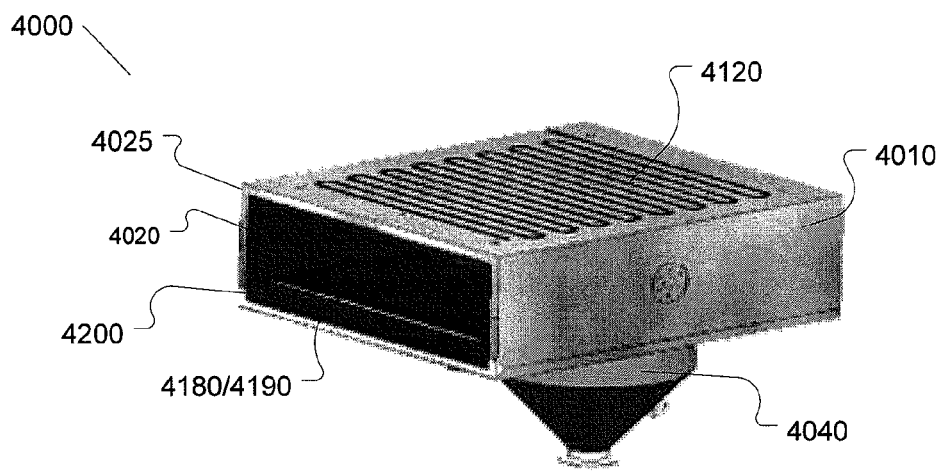
FIG. 4 depicts an isometric view of an assembled ALD reaction chamber configured with a removable liner according to an embodiment of the present invention.

Referring to FIGS. 1 and 2, an exemplary first embodiment of an atomic layer deposition system (ALD) (2000) configured according to the present invention is constructed with a floor standing system cabinet (2010) supported on four feet (2020) having a front face (2030) that includes an access door assembly (2040). The access door assembly (2040) includes a door handle (2050) mounted on an outer door panel (2060). Both the outer door panel (2060) and the door handle (2050) are thermally insulated to protect an operator when handling the door handle (2050). The access door assembly (2040) is shown in a closed or operating position in FIG. 1 and in an open or loading/unloading position in FIG. 2. The access door assembly (2040) provides access through the system cabinet (2010) to a gas deposition or reaction chamber (4000) described below. The gas deposition chamber (4000) is housed inside the system cabinet (2010) behind the access door assembly (2040). In the first example ALD system shown in FIGS. 1 and 2, the gas deposition chamber (4000) is configured to coat solid substrates using ALD coating cycles and the access door assembly (2040) provides the only access to the gas deposition chamber (4000). Accordingly, substrates to be coated are loaded into the gas deposition chamber (4000) and removed from the gas deposition chamber (4000) through the access door assembly (2040). As will be recognized, the present invention is not limited to ALD coating cycles but can be used in various reaction chamber environments wherein reactants may contaminate the chamber walls. An advantage of the first exemplary embodiment is that is has a small floor space footprint. The small floor space footprint is due in part to the position of input and output plenums used to deliver and remove reactant gases from the reaction chamber. In particular, as will be described below, the input and output plenums are incorporated within the reaction chamber volume and therefore do not increase the floor space footprint of the ALS system (2000).

Reaction Chamber

Referring now to FIGS. 3-6 a first example gas deposition chamber or reaction chamber assembly (4000) according to the first embodiment of the present invention includes an outer wall assembly (4010), a removable liner (4020), an input port assembly (4030) for delivering gas reactants into the reaction chamber through an input plenum and an exit port assembly (4040) for removing gases from the reaction chamber through an output plenum. As shown in the section views of FIGS. 5 and 6, the outer wall assembly (4010) comprises a rectangular shell structure formed by opposing and substantially parallel top and bottom rectangular outer walls (4050) and (4060), opposing and substantially parallel rectangular side outer walls (4070) and (4080) and opposing and substantially parallel rectangular front and back outer walls (4090) and (4095). The rectangular shell structure of the outer wall assembly (4010) encloses an outer volume (4110) which has a front-to-back longitudinal length and a side-to-side transverse width in a horizontal plane and a vertical height. The longitudinal length is shown in the side view of FIG. 5 and the transverse width is shown in the back cutaway view of FIG. 6 with the vertical height shown in both figures. An outer aperture (4100), shown in FIG. 3, passes through the front outer wall (4095) to the outer volume (4110). In the present example, the outer volume has a rectangular cross-section in the horizontal and vertical planes and the outer aperture (4100) is rectangular in the vertical plane with a transverse width and a vertical height dimension substantially matched to the transverse width and vertical height dimensions of the outer volume (4110). More generally, the outer walls may have various shapes and sizes to enclose an outer volume of a desired shape and size without deviating from the present invention. Moreover, the outer aperture (4100) may be formed with various shapes and sizes and extend through any one of the side, top or bottom outer walls to provide access to the outer volume as required by the application. In particular, various outer wall configurations can be used to enclose an outer volume with various polygon or circular shaped cross-sections, including a cylindrical or pipe chamber, without deviating from the present invention.

Generally, the outer wall assembly (4010) comprises an oven structure that includes or may include resistive heating elements, or the like, (4120) disposed on or in grooves formed in external surfaces of all or some of the outer walls (4050-4095). Alternately, according to an advantage of the present invention, the heating elements (4120) may be disposed on or in grooves formed on internal surfaces of some or all of the outer walls because the removable liner described below prevents the internal surfaces of the outer walls and any heating elements disposed thereon from being contaminated by reactants. Otherwise, the heating elements (4120) can be disposed inside some or all of the outer walls (4050-4095) such as by being sandwiched between opposing outer wall portions. The heating elements (4120) heat the chamber assembly (4000) to a deposition or reaction temperature and maintain the chamber assembly at the desired temperature over prolonged periods of use. In addition, solid substrates that are being coated in the reaction chamber are also heated to the reaction temperature and the solid substrates may be heated before being inserted into the reaction chamber or it may be required to delay any coating steps until the solid substrates are heated to the reaction temperature. Accordingly, the chamber assembly (4000) includes temperature sensors and one or more controllers for controlling the operation of the heating elements to achieve and maintain desired operating temperatures. Alternately, other heating means including heating elements disposed external to the outer wall assembly (4010) are usable without deviating from the present invention. In still further embodiments, the chamber assembly (4000) may not require heating elements or may instead include cooling elements to achieve desired reaction temperatures.

When heating elements are disposed outside the outer volume (4110) it is desirable to direct thermal energy into the outer volume (4110). Accordingly, the outer walls (4050-4095) preferably comprise a material having a high thermal conductivity in order to provide a conductive path between the heating elements (4120) and the outer volume (4110). In addition, it is desirable that the outer wall material meet its structural and thermal property characteristics over the range of operating temperatures that the chamber assembly (4000) is expected to be subjected to, e.g. 85-500° C.

Ideally, the outer wall assembly (4110) comprises a substantially gas tight structure when the access door (2040) is in a closed position. In particular, the outer volume (4110) may be pumped to vacuum pressures ranging down to about 10 microtorr to remove contaminants, reactants, and reactant byproducts from the chamber assembly and to maintain the outer volume at a desired vacuum pressure during coating cycles. Accordingly, it is desirable to join the outer walls (4050-4095) with welded seams to prevent gas leaks and to configure any ports and fittings associated with the ports that pass through the outer walls (4050-4095) with gas tight gaskets and the like as are generally used in vacuum chambers.

In the present example, the preferred material for constructing the outer walls (4050-4095) is aluminum and particularly 6061 aluminum, which has good weldability, an acceptable thermal conductivity of approximately 167 W/m-K or 1160 BTU-in/hr-ft$^2$-° F., and a melting temperature of approximately 600° C. or 1150° F. Alternately, any weldable aluminum, other weldable metals or ceramic materials can be used without deviating form the present invention. Preferably, the outer walls (4050-4095) comprise sheet or plate stock, folded, formed, machined, welded and fastened together as required to enclose the outer volume (4110) with gas tight seams and to provide the desired structural and thermal performance characteristics. Moreover, one or more of the outer walls (4050-4095) may be made thicker than required to perform structurally in order to provide a heat sink suitable for maintaining the outer wall assembly (4010) at a desired operating temperature and allow quick reheating e.g. after the access door has been opened and new substrates have been added for coating. In the preferred embodiment, a layer of thermal insulation is disposed over the external surfaces of the outer walls (4050-4095) to reduce thermal radiation to the air surrounding the outer wall assembly (4010).

Removable Liner

Referring to FIGS. 3-6, the reaction chamber (4000) further comprises a removable liner (4020). The removable liner (4020) comprises a shell structure sized to fit into the outer wall assembly (4010) when installed through the outer aperture (4100). The liner (4020) is configured to line the inside surfaces of the outer walls and specifically the top and bottom outer walls (4050, 4060), the side outer walls (4070, 4080) and the back outer wall (4090). In the example first embodiment of the present invention the removable liner (4020) comprises opposing and substantially parallel top and bottom rectangular liner walls (4130, 4140), opposing and substantially parallel side rectangular liner walls (4150, 4160) and a rectangular back liner wall (4170), shown in FIG. 5. The removable liner (4020) encloses a reaction chamber or inner volume (4190), which has a front-to-back longitudinal length and a side-to-side transverse width in a horizontal plane and a vertical height. The removable liner further includes a chamber aperture (4180) passing through one of the liner walls to provide access to the reaction chamber (4190). In the present example the reaction chamber (4190) has a rectangular cross-section in the horizontal and vertical planes and the chamber aperture (4180) is substantially rectangular in the vertical plane with a transverse width and vertical height dimension substantially matched to the transverse width and vertical height dimensions of the reaction chamber (4190). As best viewed in FIGS. 3 and 4, the chamber aperture (4180) faces front in the reaction chamber assembly and is substantially centered in the outer aperture (4100) such that the outer aperture (4100) receives the removable liner (4020) into the outer volume (4110) and the chamber aperture (4180) receives substrates to be coated into the reaction chamber (4190) formed by the removable liner.

The removable liner (4020) also includes a rectangular flange (4200) surrounding the chamber aperture (4180) and the flange substantially forms the removable liner (4020) front wall. The flange (4200) stiffens the removable liner (4020) to prevent buckling and distortion of the liner and of the chamber aperture (4180). The flange (4200) contacts the front outer wall (4095) when the removable liner is installed into the outer wall assembly (4010). The front outer wall face (4095) includes a rectangular recess (4205) surrounding the outer aperture (4100) for receiving the rectangular flange (4200) therein. In the installed position, an inside surface of the flange (4200) is in mating contact with the rectangular recess (4205) and an outside surface of the flange (4200) is flush with the outside surface of the front outer wall (4095).

In its operating position, the removable liner (4020) makes mating contact with several surfaces of the outer wall assembly (4010). Ideally, the removable liner (4020) is sized to exactly mate with all or most internal surfaces of the outer rectangular volume (4110) such that an uninterrupted thermal conduction path extends from the heating elements (4120) to surfaces of the removable liner (4020) and to substrate trays (described below) supported by the removable liner (4020). However, exact mating over all surfaces is not practical so the removable liner (4020) and or outer wall assembly (4010) may be configured with contacting surface features e.g. bumps, ridges, interlocking guides, etc., not shown in the first example embodiment, with sufficient mating contact area provided between the outer walls and the removable liner to readily conduct thermal energy from heating elements to all surfaces of the removable liner. In addition, a thermal conduction pathway is provided at the interface between the rectangular flange portion (4200) and the front face (4025). In areas where there is no mating contact between the outer walls and the removable liner, a clearance gap volume, e.g. the clearance gap volume (4215) shown in FIG. 6, extends between external surfaces of the liner walls (4130-4170) and internal surfaces of the outer walls (4050-4090). The clearance gap volume (4215) is continuously purged with an inert gas to prevent reactants from reacting with the outside wall assembly (4010).

The removable liner (4020) and the outer wall assembly (4010) may be mechanically interlocked such as by sliding interlocking features e.g. by a rod or bar guided in a slot or by a dovetail bar guided in a mating dovetail slot or the like. With one half of the interlocking feature on the removable liner (4020) and the other half on the outer wall assembly (4010), the interlocking features serve to align and guide the removable liner (4020) into and out of its desired operating position and may increase thermal conduction by increasing the area of mating contact between the liner and outer walls. In a preferred embodiment, the removable liner (4020) is mechanically held in place by its engagement or mating contact with the outer wall assembly (4010). Accordingly, the removable liner (4020) is held in place without fasteners. This provides an advantage that a contaminated liner can be removed and replaced with a clean liner quickly and without tools. This further eliminates the problem of dealing with reactant build up on fasteners, which may render the fasteners unusable. Alternately, fasteners can be used to fasten the flange portion (4200) to the front outer wall (4095).

In a preferred embodiment, the removable liner (4020) comprises a material that can be cleaned to remove reactant contaminants from its surfaces and be reused in the reaction chamber assembly; however, disposable liners also can be used and are within the scope of the present invention. In addition, it is desirable that the liner material meet its structural and thermal property characteristics over the range of operating temperatures that the chamber assembly (4000) is expected to be subjected to, (85-500° C.). Additionally the liner material should have good resistance to breakdown and or other detrimental reactions with reactants that the chamber assembly (4000) is expected to be subjected to. In addition, since the liner is periodically removed and replaced, it is desirable to keep the liner weight low.

It is desirable to clean liners removed from the reaction chamber assembly to remove contaminants therefrom. Solid film layers deposited onto the removable liner by reactants or precursors are removed primarily by abrasive blasting, e.g. sand, shot or bead blasting and the liner material should be able to withstand repeated abrasive blasting. Moreover, internal surfaces of the removable liner (4020) are abrasive blasted during fabrication to roughen surfaces that may become coated with thin film build up because the thin film build up has better adhesion to the roughen surfaces and is therefore less susceptible to peeling or cracking. Otherwise, the solid film layers can be removed by chemical methods such by an acid etching or using solvents or the like. In other cases, the liner may become contaminated by an undesirable reactant or reaction byproduct and need to be replaced immediately for safety reasons. In this case is beneficial to have a clean liner on hand and to clean the contaminated liner for reuse as required.

According to the present invention the removable liner comprises thin single layer sheet metal walls comprising stainless steel ranging in thickness from 0.5-2.0 mm thick (0.02-0.80 inch). The stainless steel is readily cleanable by a bead blast using 180-grit glass or ceramic beads after a high-pressure hot deionizer water wash. In particular, the stainless steel has a Brinell Hardness of approximately HB 200, which is high enough to be subjected to repeated bead blasting. Otherwise, the stainless steel liner is readily cleanable by a hydrofluoric acid in a liquid bath or vapor chamber. Additionally the stainless steel liner meets the thermal and structural requirements.

Preferably, the removable liner (4020) is formed as a unitary element such as by cold forming or deep drawing the liner from a preformed blank. Otherwise the liner is formable by various know sheet metal forming methods. Ideally, the removable liner forms a gas tight reaction chamber (4190) with gas tight, e.g. welded seams and gas sealed fitting interface apertures that prevent reaction gases from reaching the outer wall assembly (4010). However, in practical embodiments, some leakage through the removable liner (4020) into the clearance gap volume (4215) between the removable liner (4120) and the outer wall assembly (4010) is expected. Accordingly, a pressure gradient may be established between the clearance gap volume (4215) and the reaction chamber (4190) by purging the clearance gap volume (4215) with an inert gas provided at a gas pressure that is higher than the gas pressure inside the reaction chamber, e.g. an inert gas at atmospheric pressure or greater.

Pressurized Clearance Gap

Figure 6:
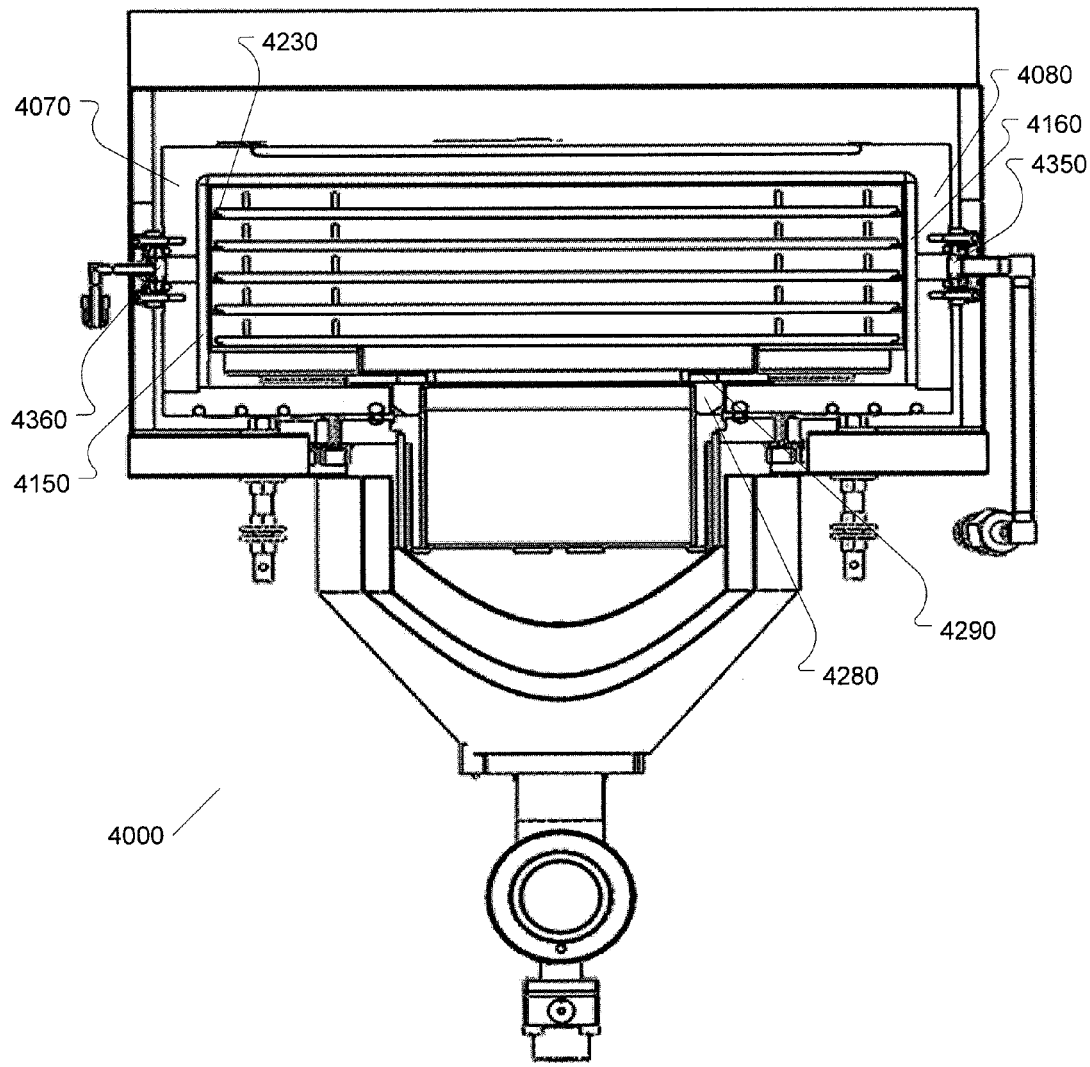
FIG. 6 depicts a rear section view taken through an exemplary improved ALD reaction chamber configured with a removable liner and a purge gas input port for delivering purge gas to a small clearance gap formed between the removable liner and an outer wall assembly of an exemplary improved ALD reaction chamber according to an embodiment of the present invention.

Referring now to FIG. 6, the clearance gap volume (4215) is purged with inert gas through a gas input port (4350). The port (4350) installs through the side outer wall (4080) and is in fluidic communication with a gas supply container to deliver an inert purge gas into the clearance gap volume (4215) surrounding the removable liner (4020). Preferably, the purge gas is nitrogen. Purge gas is substantially constantly delivered into the clearance gap volume (4215) preferably at atmospheric pressure or greater. A gas output port (4360) passing through the side outer wall (4070) is in fluidic communication with clearance gap volume (4215). The output port (4360) includes a pressure relief valve, not shown, set to relieve excess pressure in clearance gap volume (4215) if the pressure therein exceeds a preset pressure limit. The preferred pressure in the clearance gap volume (4215) exceeds the pressure in the reaction chamber to prevent gas in the reaction chamber (4190) from leaking into the clearance gap volume (4215). The continuous flow of inert gas flowing into the clearance gap volume (4215) through the port (4350) fills the clearance gap volume (4215) and then leaks into the reaction chamber through any leaks in the removable liner (4020). The inert gas leaked into the reaction chamber is exhausted out of the reaction chamber through the exit port described below. The gas pressure in the clearance gap volume (4215) is maintained at about 1-5 pounds per square inch above atmospheric pressure. Any higher gas pressures will cause the relief valve to open to reduce the pressure inside the clearance gap volume (4215) and exhaust gas out of the clearance gap volume (4215) through the port (4360). In other embodiments, one or both of the ports (4350) and (4360) may be in fluidic communication with the reaction chamber exit port assembly (4040) or another conduit in fluidic communication with the system vacuum pump, described below, to evacuate the clearance gap volume (4215) and maintain the gas pressure in the clearance gap volume (4215) at less than atmospheric pressure but still at a higher pressure than is maintained inside the reaction chamber (4190).

Access Door

Figure 5:
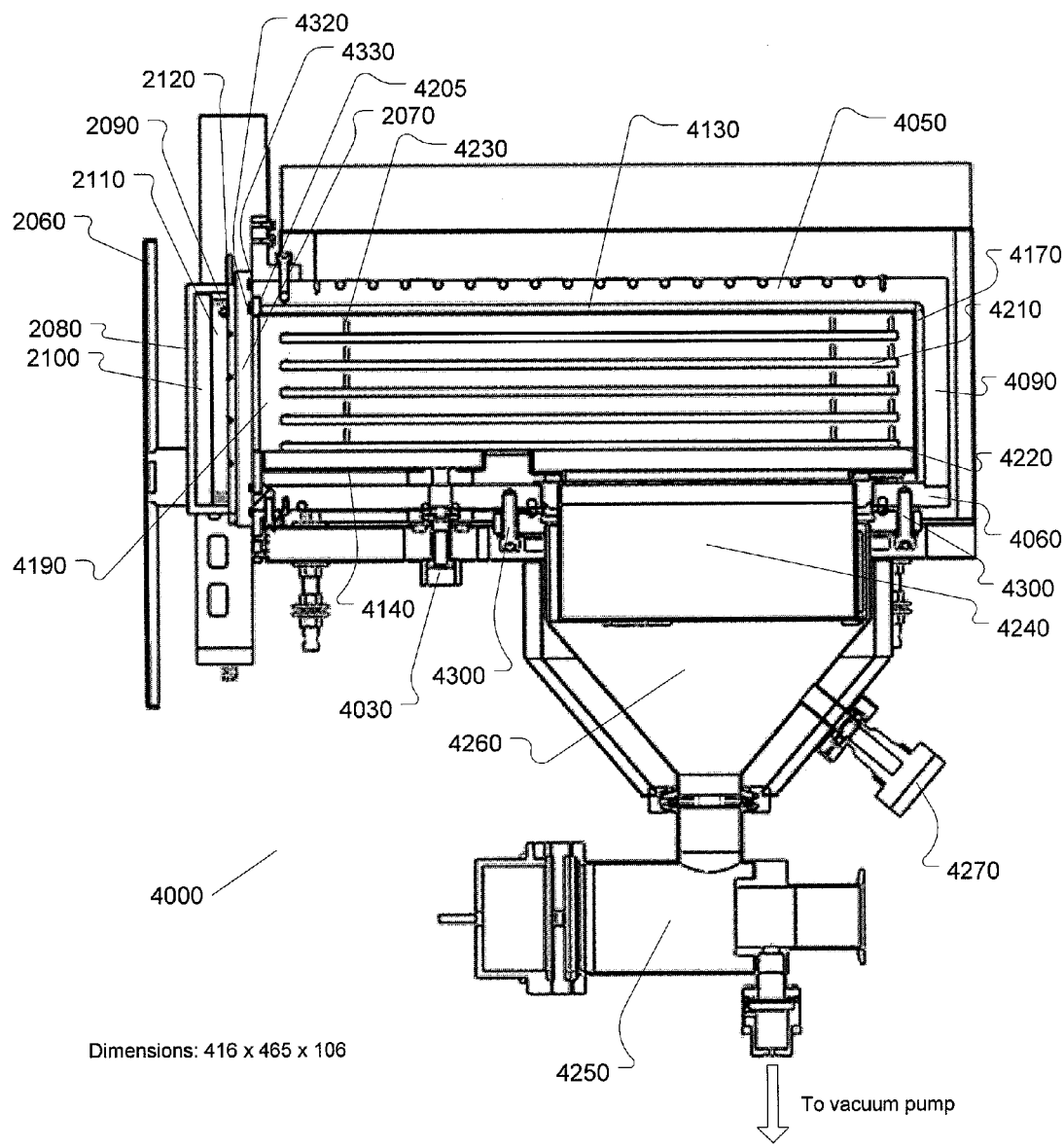
FIG. 5 depicts a side section view taken through an exemplary improved ALD reaction chamber configured with a removable liner and five substrate trays according to an embodiment of the present invention.

Referring to FIG. 5, the access door assembly (2040) is shown in side view in the closed position. The access door assembly (2040) includes the outer door panel (2060), the door handle (2050), an inner door panel (2070), a door cover (2080), a door heating element (2090), disposed between the inner door panel (2070) and a thermal insulation layer (2100) disposed between the door heating element (2090) and the door cover (2080). The inner door panel (2070) has rectangular dimensions that exceed the rectangular dimension of the front outer wall (4095). In the present embodiment, the entire access door assembly (2040) is supported on one or more vertically disposed rails or rods, not shown, to move the door assembly vertically upward, or downward, to an open position to allow access to the reaction chamber (4190) through the chamber aperture (4180). In the closed position, shown in FIG. 5, the inner door panel seals both the outer aperture (4100) with a first outer rectangular o-ring seal (4320) and the chamber aperture (4180) with a second inner rectangular o-ring seal (4330). Each of the o-ring seals (4320) and (4330) has an closed rectangular form that fits into a matching rectangular groove formed on the inner door panel (2070) facing the reaction chamber. The o-ring seals may have a circular or square cross-section and may comprise a material suitable for the sealing application, e.g. a metal o-ring suitable for the range of temperature and pressure of the reaction chamber.

The heating assembly (2090) includes a rectangular aluminum plate (2110) approximately matching the rectangular dimensions of the inner door panel (2070) and mounted in mating contact therewith. A resistive heating element (2120) is mounted in mating contact with the rectangular aluminum plate (2110) opposed to the inner door panel (2070) such that thermal energy generated by the heating element (2120) is conducted through the rectangular aluminum plate (2110) and through the stainless steel inner door panel (2070) to radiate into the reaction chamber (4190). The insulation layer (2100) is rectangular and approximately matches the dimensions of the aluminum plate (2110) and is mounted in contact with the heating assembly (2090) opposed to the inner door panel (2070). The door cover (2080) is attached to the aluminum plate (2110) and holds the insulation layer (2100) in place.

According to a further aspect of the present invention, the stainless steel inner door panel (2070) is removable from the access door assembly (2040) for periodic cleaning and replacement. In particular, the inner door panel (2070) is removed when the removable liner (4020) is removed for cleaning and both the removable liner (4020) and the inner door panel (2070) are cleaned. Alternately, either of the inner door panel or removable liner may be disposed of and replaced with new elements. The cleanable inner door panel (2070) is fabricated from stainless steel so that it can be cleaned using bead blasting or a chemical method as described above in relation to cleaning the removable liner. Preferably, the inner door panel (2070) is attached without fasteners or at least without fasteners that are exposed to the reaction chamber (4190). The inner door panel (2070) may be clamped or held in place by interlocking features located between the inner door panel (2070) and the aluminum plate (2110). Preferably the surface of the inner door panel that faces the reaction chamber is bead blasted during fabrication to roughen the surface for improving adhesion by coating layers formed thereon.

Substrate Support

Figure 7:
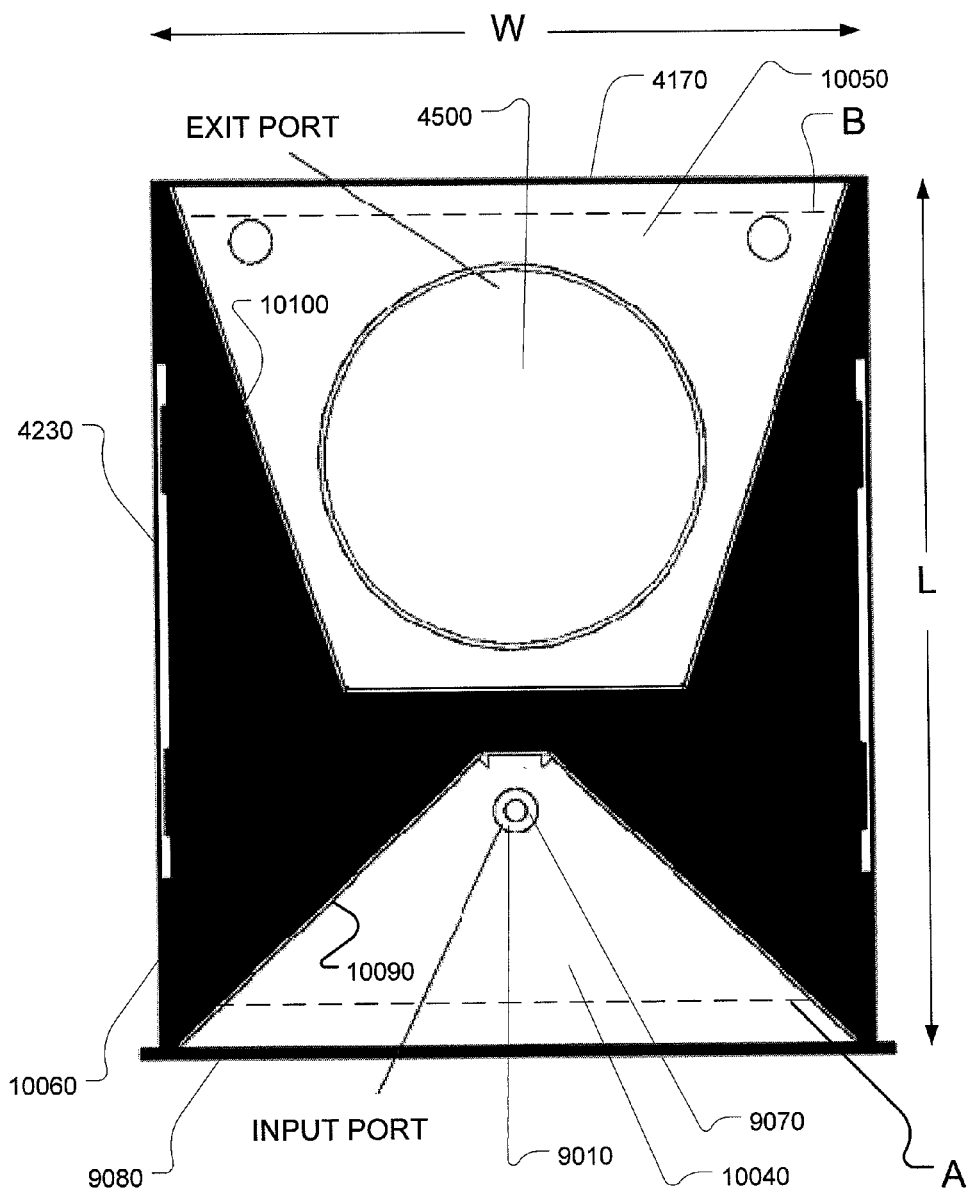
FIG. 7 depicts a top section view taken through a removable liner depicting a reaction chamber input aperture proximate to the apex of a triangular plenum and a larger reaction chamber exit aperture proximate to the narrow end of a trapezoidal plenum according to an embodiment of the present invention.
Figure 8:
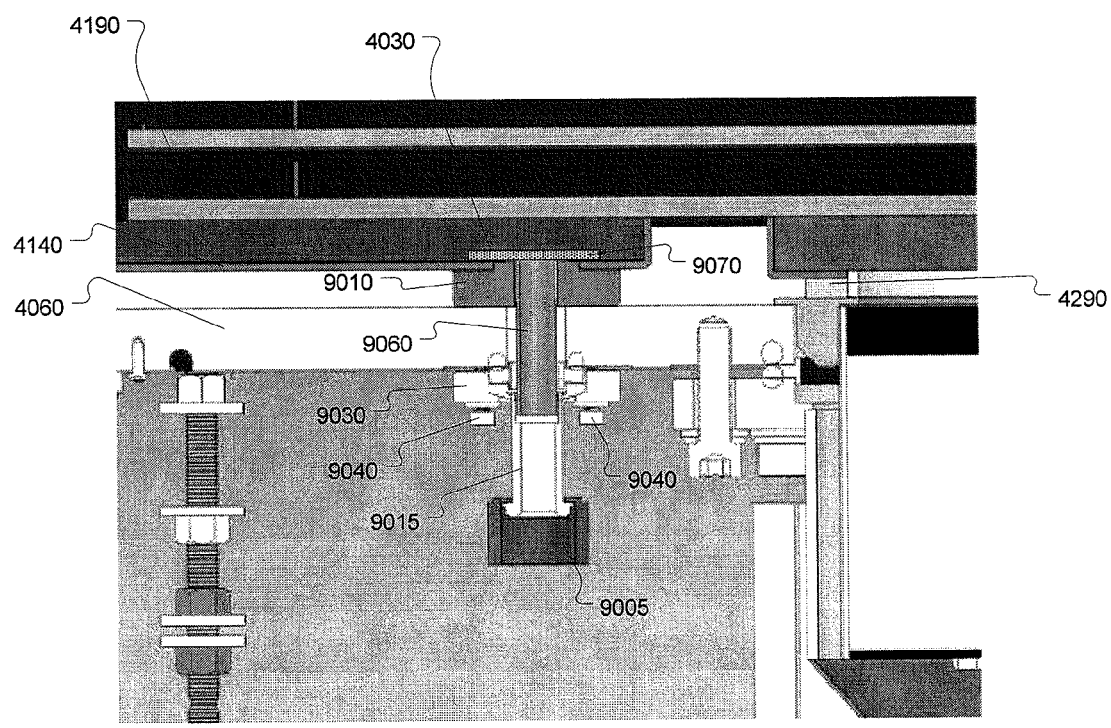
FIG. 8 depicts a side section taken through an improved ALD reaction chamber input port assembly according to an embodiment of the present invention.
Figure 9:
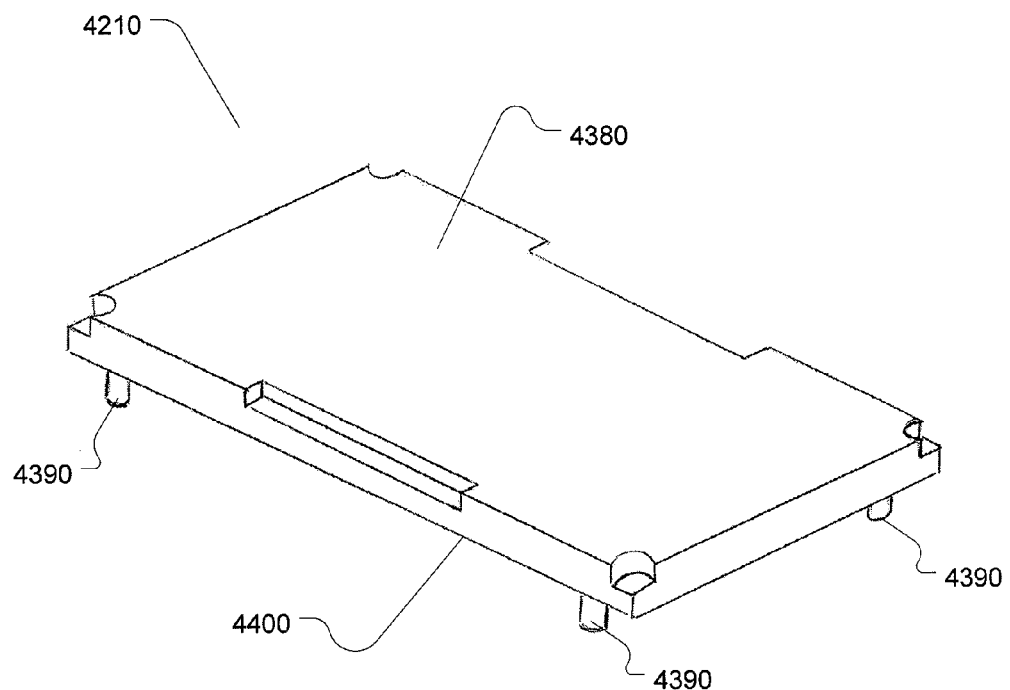
FIG. 9 depicts an isometric view of a substrate tray suitable for supporting substrates inside a removable liner installed into an improved ALD reaction chamber according to an embodiment of the present invention.

Referring now to FIGS. 5-9 the reaction chamber (4190) of the first example embodiment is configured to support a plurality of substrate trays (4210), shown in FIG. 9, on tray supports (4230), shown in FIG. 7. The tray supports (4230) are attached to and extend out from opposing side walls (4150, 4160) of the removable liner (4020) to receive the substrate trays thereon. The substrate trays (4210) may be gravity supported on the tray supports (4230) or may be otherwise fastened or clamped to the side walls (4150, 4160) or supported from the top or bottom liner walls (4130, 4140). Preferably, each substrate tray (4210) is fabricated from ALPASE K100-S which is an aluminum plate material specifically designed for vacuum applications and which possesses desirable characteristics for gas deposition environments such as dimensional stability, excellent machinability, weldability, low stress content, and equiaxial grain structure. Preferably, the tray supports (4230) and substrate trays (4210) provide a thermally conductive path extending from the removable liner (4020) to solid substrates supported on the substrate trays (4210) to reduce the time required to heat substrates to a desired reaction temperature. Aluminum is particularly desirable for the substrate trays (4210) because of its high thermal conductivity (e.g. 812 BTU-in/hr-ft$^2$-° F.) to quickly and uniformly conduct thermal energy to substrates supported thereon, thereby raising the substrate temperature to a desired deposition temperature more quickly than other substrate tray materials. The substrate trays (4210) are not cleanable by the bead blasting or chemical cleaning processes described above and therefore are usually disposed of and replaced with new trays when they become unusable due to material contamination built up by many deposition cycles. Alternately, the substrate trays (4210) can be fabricated from stainless steel so that the trays can be cleaned and reused or other cleaning methods more suitable for aluminum trays may be used to clean the aluminum trays.

Solid substrates in the form of thin rectangular glass sheets are loaded one on each substrate tray (4210) for ALD, ALE or other gas deposition coating. The substrates are only coated on exposed surfaces so the substrate bottom surface is not coated. As shown in FIG. 5 the reaction chamber includes five substrate support trays in the reaction chamber (4190). In the present example embodiment, the longitudinal length and transverse width of the substrate trays (4210) support a GEN 1 rectangular glass plate disposed horizontally thereon. In particular, the GEN 1 substrate has length and width dimensions of 400×300 mm and the example rectangular reaction chamber (4190) has length and width dimensions of 465 mm (18.3 in.) and 416 mm (16.4 in.). Of course larger reaction chambers with similar characteristics can be constructed to receive larger rectangular glass plates thereon, (e.g. GEN 2-7, or larger) without deviating from the present invention. In addition, the substrate trays (4210) can be removed and other solid substrate types such as batches of circular wafers held in coating cassettes and various other solid substrates standing alone or supported on various substrate holding elements can be loaded into the reaction chamber (4190).

Referring to FIG. 9, a substrate tray (4210) is shown with its bottom surface (4380) facing upward. Each substrate tray may include a plurality of stop pins (4390) or similar alignment aids that extend vertically up from a top surface (4400) or from a side surface of the substrate trays. The stop pins (4390) serve as a guide for aligning edges of substrates supported on the support tray.

In the present example embodiment shown in FIGS. 6 and 7, the reaction chamber (4190) has a vertical height of 106 mm (4.17 in.) and is configured to support five substrate trays (4210) disposed horizontally and substantially evenly spaced apart vertically. According to one aspect of the invention, each of the five substrate trays (4210) is removable from the reaction chamber (4190) through the chamber aperture (4180) when the access door (2040) is open. Thus, the reaction chamber (4190) is operable using any combination of from one to five substrate trays (4210); however, as will be described in detail below, it is preferable to keep a bottom tray (4220) or a suitable substitute for a bottom tray in place for most gas deposition applications.

Input Port Assembly

Referring to FIG. 5, the input port assembly (4030) passes through each of the bottom outer wall (4060) and the bottom liner wall (4140) to deliver reactants or precursors into the reaction chamber (4190). Other gases such as an inert purge gas may also be delivered into the reaction chamber (4190) through the input port assembly (4030) as required. In a preferred embodiment, the chamber assembly (4000) utilizes a single input port (4030) that is in fluidic communication with an input manifold fluidly connected with a plurality of gas containers and configured to precisely deliver desired volumes of reactants or precursors and other gases into the reaction chamber (4190) according to predefined coating cycle formulas. Generally, the reaction chamber assembly is configured to deliver a flow of source material comprising one or more gases, vapors, aerosols or the like into the reaction chamber through the input port assembly (4030). In addition, the input manifold is configured to deliver a continuous flow of an inert purge gas, e.g. nitrogen, to flush out the reaction chamber (4190) and the input port assembly (4030) as may be required. In other embodiments, a plurality of input ports can be used with each input port being in communication with different gas supply containers. In other embodiments, input ports can pass through other walls of the reaction chamber (4190) without deviating from the present invention.

FIG. 8 depicts a section view taken through the input port assembly (4030) and the interface of the input port assembly (4030) with the bottom outer wall (4060) and the bottom liner wall (4140). Gasses are delivered into the reaction chamber (4190) through an input port (9010), which passes through the bottom liner wall (4140). A gas fitting (9005) suitable for attaching to an input manifold, not shown, and receiving input gasses therefrom is supported on an outer tube (9015). The outer tube (9015) extends from the gas fitting (9005) and passes substantially through the bottom outer wall (4060). An input port flange (9030) is attached to the bottom outer wall (4060) by screws (9040) and includes a through aperture for receiving the outer tube (9015) there through. A precursor tube (9060) installs into the outer tube (9015) from inside the reaction chamber (4190). In particular, the precursor tube (9060) installs through the input port (9010) and extends from inside the reaction chamber (4190) to fit snugly into the inside diameter of the outer tube (9015). The precursor tube (9060) engages with the outer tube (9015) to a length that extends beyond the bottom outer wall (4060). The precursor tube (9060) has an outside diameter that closely matches the inside diameter of the outer tube (9015) to reduce leakage therebetween. The precursor tube (9060) is withdrawn from the outer tube (9015) in order to remove the removable liner (4020) from the outer wall assembly (4010) and preferably the precursor tube is removable from the outer tube by hand, without using tools.

Exit Port Assembly

Referring to FIG. 5, the exit port assembly (4040) is disposed between and in fluidic communication with the reaction chamber volume (4190) and a vacuum pump, not shown. The exit port assembly (4040) includes a trap (4240), a vacuum valve (4250), a cone shaped conduit (4260), disposed between the trap (4240) and the vacuum valve (4250), and a pressure gage (4270) disposed to measure pressure in the cone shaped conduit (4260).

Referring to FIGS. 3, 5, 6, and 7, the cone shaped conduit (4260) includes a cylindrical flange (4280) attached to the bottom outer wall (4060) with attaching screws (4300). The cylindrical flange (4280) supports the entire exit port assembly (4040). An exit port (4500) passes through the bottom liner wall (4140) and fluidly connects with the cone shaped conduit (4260) through a trap seal, (4290). The trap seal (4290) comprises an annular o-ring, e.g. a stainless steel o-ring, positioned between the cylindrical flange (4280) and the bottom liner wall (4140) surrounding the exit port (4500). The trap seal (4290) is attached to the bottom outer wall (4060) and a top surface of the trap seal is positioned to receive the bottom liner wall (4140) thereon when the removable liner is installed into the outer volume.

The trap seal (4290) functions as a gas seal between the removable liner (4020) and the cylindrical flange (4280) to gas seal the interface between the exit port assembly (4370) and the bottom outer wall (4060). The removable liner and trap seal are drawn tightly together in reaction to a pressure drop in the cone shaped conduit generated by the vacuum pump. However even in the event that the trap seal (4290) leaks, the surrounding volume is purged with inert gas at a higher pressure than the gas pressure in side the reaction chamber and cone shaped conduit so that any leakage is substantially inert gas leaking into the reaction chamber so that reactants are prevented form leaking out. One of the removable liner, cylindrical flange, bottom outer wall or trap seal may include feature provided thereon to engage the exit port with the trap seal when the removable liner is installed.

The trap comprises a cylindrical trap (4240) or appropriate filter disposed in the fluid path of gasses drawn out of the reaction chamber (4190) by the vacuum pump. The trap serves to trap, react with, filter or otherwise prevent undesirable materials from exiting from or damaging the gas deposition system, or its components, such as the vacuum pump, valves or piping. The trap (4310) is configured for periodic replacement as required.

Gas Flow Dynamics

Figure 10:
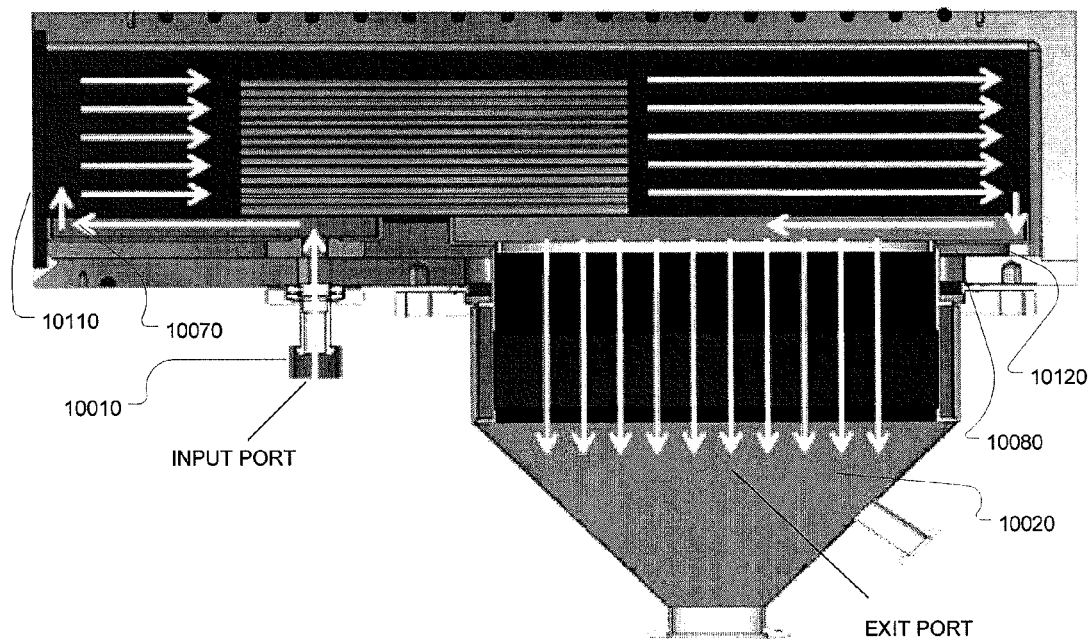
FIG. 10 depicts a side section view of an improved ALD reaction chamber showing the gas flow path from input port to exit port through an exemplary embodiment of the improved ALD reaction chamber according to the present invention.

Referring now to FIGS. 7 and 10 the removable liner (4020) is shown in top section view in FIG. 7, which is substantially a top view of the bottom liner wall (4110). As shown, the input port (9010) comprises a small aperture, e.g. 12 mm (0.47 inch), substantially centered with respect to a transverse width W of the bottom liner wall (4110) and positioned approximately one third of the longitudinal length L away from a front edge (9080) of the bottom liner wall (4110). The input port (9010) is positioned near an apex of a triangular input plenum (10040). As will be further described below, the bottom liner wall (4110) cooperates with a bottom substrate tray (4220) to substantially enclose a triangular input plenum volume and the input plenum volume is open to a front region of the reaction chamber over its full transverse width W. In preferred embodiments, the input plenum is shaped in a manner allows gas entering the reaction chamber to continuously expand in volume as it flows from the input port (9010) to the reaction chamber. Moreover, the shape of the input plenum volume preferably allows reactant gases to expand to fill the full transverse width W of the reaction chamber before the reactant gases reach surfaces of the substrates to be coated. The increase in gas volume in the input plenum further serves to reduce the gas flow velocity and vapor pressure prior to the gas reaching the reaction chamber.

The exit port (4500) comprises a large aperture, e.g. 200 mm (7.87 inches), substantially centered with respect to the transverse width W and positioned approximately two thirds of the longitudinal length L away from the front edge (9080). The exit port (4500) is positioned proximate to a narrow width of a trapezoidal exit plenum (10050). As will be further described below, the bottom liner wall (4110) cooperates with a bottom substrate tray (4220) to substantially enclose a trapezoidal input plenum volume and the input plenum volume is open to a back region of the reaction chamber over its full transverse width W. In preferred embodiments, the exit plenum is shaped in a manner allows gas to be draw from the reaction chamber substantially over its full transverse width W and to continuously decrease in volume as it flows from the reaction chamber to the exit port (4500). Moreover, the decrease in gas volume shape of the input plenum volume preferably allows reactant gases to expand to fill the full transverse width W of the reaction chamber before the reactant gases reach surfaces of the substrates to be coated The decrease in gas volume in the exit plenum further serves to increase the gas flow velocity and vapor pressure prior to the gas exiting the reaction chamber and this increase in flow velocity reduces the time required to purge the reaction.

The bottom liner wall (4140) includes an upper horizontal wall portion (10060), shown black in FIG. 7 and two lower horizontal wall portions (10070) and (10080). All three horizontal wall portions (10060-10080) are substantially parallel and horizontal. The upper horizontal wall portion (10060) is separated from each of the lower horizontal wall portions (10070) and (10080) by approximately 20 mm (0.78 inch).

The upper horizontal wall portion (10060) forms a floor surface of the removable liner (4020) and may be used to support the bottom substrate tray (4220) thereon. A triangular lower horizontal wall portion (10070) comprises a bottom surface of the triangular plenum (10040) and includes the input port (9010) passing therethrough. A trapezoidal horizontal wall portion (10080) comprises a bottom wall of the trapezoidal plenum (10050) and includes the exit port (4500) passing therethrough. The triangular plenum (10040) is bounded by a continuous triangular vertical wall (10090) that extends between the upper horizontal wall portion (10060) and the lower horizontal wall portion (10070). The trapezoidal plenum (10050) is bounded by a continuous trapezoidal vertical wall (10100) that extends between the upper horizontal wall portion (10060) and the lower horizontal wall portion (10080).

Referring now to FIG. 10 a side section view of the chamber (4000) schematically depicts gas flow through the chamber when a plurality of horizontal substrate support trays (4210) are installed therein. The bottom substrate tray (4220) is supported parallel with and substantially in contact with the upper horizontal wall portion (10060) to partially cover each of the triangular plenum (10040) and the trapezoidal plenum (10050). As gasses enter the chamber through the input port (9010) they expand to fill the triangular plenum (10040). However, the location of the bottom support tray (4220) acts as a baffle or vane that prevents upward flow of the gasses out of the triangular plenum (10040) except at the base or widest part of the triangular plenum (10040) proximate to a front edge of the reaction chamber (4190). In particular, the bottom substrate tray (4220) and each of the other substrate trays is positioned with it's front edge approximately disposed along the dashed line A shown in FIG. 7, which is approximately 30 mm (1.18 inch) from the front edge (9080).

Forward of the dashed line A, gasses flowing into the triangular plenum (10040) begin to expand vertically upward to substantially fill a front vertical gas flow channel (10110). The front vertical gas flow channel (10110) extends vertically upward from the triangular lower horizontal wall (10070) proximate to the base or widest part of the triangular plenum to the top liner wall (4130) and extends horizontally substantially across the entire transverse width of the reaction chamber (4190).

The front vertical gas flow channel (10110) is in fluidic communication with the reaction chamber (4190) above the bottom substrate tray (4220) which extends over the longitudinal length L and transverse width W and has a vertical height that encloses the five horizontally disposed substrate support trays (4210) spaced vertically apart with sufficient space in between trays to allow a sufficient volume of reactant gas to flow over each substrate tray. In particular, the gas expands to flow from the front vertical flow channel (10110) into the open volume between the substrate trays (4210 and 4220) where the gas flows over and around any substrates that are supported on the substrate trays. Moreover, the gas flow between the substrate trays is substantially uniformly distributed over the chamber transverse width W and is substantially laminar to ensure uniform distribution of reactant over the exposed surfaces of the substrates as the gas flows from front to back in the reaction chamber (4190).

The location of a back edge of the bottom support tray (4220) acts as a baffle that prevents downward flow of the gasses into the trapezoidal plenum (10050) except at the widest part of the trapezoidal plenum (10050) proximate to the back liner wall (4170). In particular, the bottom substrate tray (4220) and each of the other substrate trays is positioned with back edges thereof approximately disposed along the dashed line B shown in FIG. 7, which is approximately 30 mm (1.18 inch) from the inside surface of the back liner wall (4170).

Forward of the dashed line B, gasses are flowing over the five substrate trays and are blocked from flowing directly into the trapezoidal plenum (10050) by the bottom substrate tray (4220). Rearward of the dashed line B gasses passing over the substrate trays enter into and substantially fill a rear vertical gas flow channel (10120). The rear vertical gas flow channel (10120) extends vertically from the trapezoidal lower horizontal wall (10080) proximate to the base or widest part of the trapezoidal plenum (10050) to the top liner wall (4130) and extends horizontally substantially across the entire transverse width W of the reaction chamber (4190).

The rear vertical gas flow channel (10120) is in fluidic communication with the open volume between the substrate support trays (4210) and (4220) where reaction gases flow over and around any substrates that are supported on the substrate trays. In particular, reaction gases entering from the triangular plenum (10040) expand or are drawn in response to operation of the vacuum pump through the exit port to flow from the open volume between the substrate support trays (4210) and (4220) into the rear vertical gas flow channel (10120) and then to the base of the trapezoidal plenum (10050).

In the case where the vacuum valve (4250) is closed and or the vacuum pump, not shown, is not drawing gas out from the chamber, the gas dynamics within the chamber volume are substantially governed by expansion of the input gasses to fill the volume. In the case where the vacuum valve (4250) is opened and gas is being drawn out from the chamber by the vacuum pump, a low gas pressure area is established in the trapezoidal plenum (10050) at the narrowest part of the trapezoidal plenum (10050) surrounding the exit port (4500) and the low pressure surrounding the exit port draws gas from the widest part of the trapezoidal plenum (10050) and from the rear vertical gas flow channel (10120) substantially uniformly across the entire transverse width W. In either case, the baffling provided by the bottom support tray (4220) prevents gas entering the triangular plenum (10040) from vertical upward flow until it reaches the widest part of the triangular plenum (10040) and also prevents gas from vertical downward flow into the trapezoidal plenum (10050) except at its widest part of the trapezoidal plenum. In either case, reactant gases as substantially uniformly distributed over the entire transverse width W in the open volume between the substrate support trays (4210) and (4220) where reaction gases flow over and around any substrates that are supported on the substrate trays.

As will be recognized by those skilled in the art, the volume of the front and rear flow channels (10110) and (10120) can be varied by changing the positions of front and back edges of the substrate support trays (4010) and (4020) and especially the bottom support tray (4020). In other variations of the five substrate tray configuration described above, the chamber can be configured with just one bottom substrate support tray (4020) to provide the desired plenum baffling. Alternately, one or more plenum baffles can be installed or integrally formed in the bottom liner wall (4140) instead of the using the bottom support tray (4020) as a baffle. In other configurations, the chamber can be configured with any number of substrate trays and or with other substrate holder suitable for non-rectangular substrates such as circular wafers and any other object(s) that can be fit into the reaction chamber through the access door.

ALD System Second Embodiment

Figure 11:
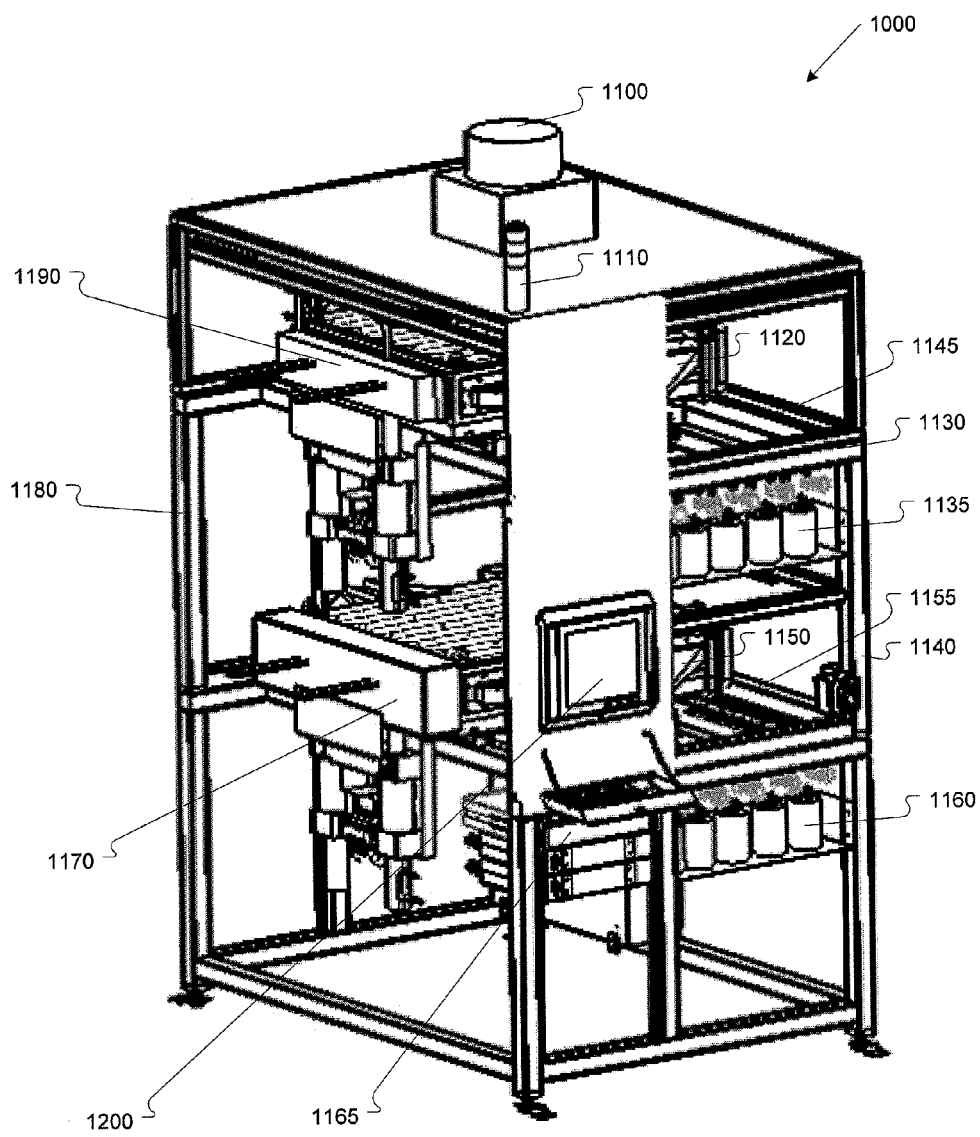
FIG. 11 depicts an isometric view showing a dual chamber gas deposition system without external skins according to an embodiment of the present invention.

A second exemplary embodiment of the present invention comprises a dual chamber gas deposition system (1000) shown in isometric view with the external skins removed in FIG. 11. The system (1000) includes a front face (1180) which is used for loading substrates into each of two gas deposition chambers (1120) and (1150). In a preferred embodiment, the front face (1180) interfaces with a clean room wall and the substrates are loaded and unloaded from inside the clean room through the clean room wall. For that reason, the removable liners installed into and removable from each of the gas deposition chambers of the second exemplary embodiment are installed and removed through a back face, opposed to the front face (1180).

A right side face (1130) includes a single user interface device (1200) which can be used to enter commands for operating both of the gas deposition chamber assemblies (1120) and (1150). In alternate embodiments, each gas deposition chamber assembly may include a separate user interface device (1200). In further alternate embodiments the control systems of both gas deposition chamber assemblies can be networked to a remote device that includes a remote user interface, not shown.

The system (1000) comprises a frame (1140) constructed to support an upper ALD or ALE reaction chamber assembly (1120) supported by an upper cross frame platform (1145) and a lower ALD or ALE reaction chamber assembly (1150) supported by a lower cross frame platform (1155). Each of the chamber assemblies (1120) and (1150) is constructed to receive a single large area rectangular substrate therein and to support the substrate in a substantially horizontal plane. In the present example, each reaction chamber assembly (1120) and (1150) is configured to coat a single GEN 4.5 glass substrate, which has rectangular dimensions of 920 mm wide by 730 mm long. The chamber assemblies (1120) and (1150) are configured with a front opening or load port having a width dimension that is larger than 920 mm for receiving the desired substrate wide dimension through the front port. Each substrate comprises a top face, to be coated, and an opposing bottom face that is not coated. The substrates have an approximate thickness of 0.5 mm, and are therefore fragile and difficult to handle. The glass substrates are used to manufacture rectangular LCD screens and the like. Each chamber assembly includes a horizontal substrate support surface for receiving a bottom face of a substrate thereon with an opposing top face of the substrate top face facing upward. Generally one GEN 4.5 substrate is loaded into a chamber assembly at a time for coating; however, a plurality of smaller glass substrates can be loaded into each of the chamber assemblies (1120) or (1150) and coated simultaneously.

The frame (1140) supports a plurality of subsystems associated with each of the two chamber assemblies (1120) and (1150). In particular, the system (1000) includes all of the subsystems required to operate each of the two chamber assemblies (1120) and (1150) independently and simultaneously. Accordingly, the upper gas deposition chamber assembly (1120) includes an upper input gas supply system (1135) and the lower chamber assembly (1150) includes a lower gas input supply system (1160). Each of the input gas supply systems (1135) and (1160) include reservoirs of reactant or precursor gases or solid or liquid reactants or precursors that can be carried by a vapor or aerosol, for delivering various precursors used in ALD and ALE coating cycles into the reaction chamber assemblies. In addition, the input gas supply systems (1135) and (1160) may include inert gases usable to purge various areas of the reaction chamber assemblies and other reactants that can be delivered into a reaction chamber as may be required for reacting with solid substrates contained within the reaction chamber assemblies. In addition, each of the input gas supply systems (1135) and (1160) includes one or more manifolds, mass flow controllers, sensors, filters, vaporizers, bubblers, atomizes or the like as may be required to prepare and delivering a volume of gas or vaporized reactant and or a purge gas into the corresponding input plenum. Additionally, each gas supply system may include a heater and temperature sensors for delivering gases at desired temperatures.

Each gas deposition chamber assembly (1120) and (1150) includes a front facing load port with a load lock door (1190) and (1170) disposed to move vertically downward, or upward as may be required, to provide access to the respective chamber through its front facing load port and to move vertically upward, or downward, to close the load port and substantially gas seal the gas deposition chamber during substrate coating cycles. Each gas deposition chamber assembly (1120) and (1150) includes an electronic controller (1165), only one shown, for controlling operations of the respective chamber, for logging data, and for processing operator input commands. In addition, both of the electronic controllers (1165) are preferably connected to a computer network in order to communicate with and exchange data and or operating commands with external devices as may be required. Generally, each electronic controller (1165) includes a programmable microprocessor, one or more digital memory devices, a network interface, a user interface, a power distribution module and interfaces to each electrical subsystem used to operate the chamber assembly. Each gas deposition chamber assembly (1120) and (1150) further includes a vacuum pump and associated vacuum hardware, detailed below, for removing contaminates, reaction gases or vapors, reaction byproducts and the like from the respective chamber and for otherwise processing and directing gas outflow from the chamber. In addition, each gas deposition chamber assembly (1120) and (1150) includes elements for heating and insulating the outer walls of the chamber and or monitoring conditions such as gas pressure, various temperatures, load lock door position, whether a substrate is loaded, safety and other conditions. In addition, the preferred dual chamber gas deposition system (1000) includes a vent (1100) located in the center of a top face for venting gas outflow from both chambers to a safe venting area and a lighting tower (1110) extending upward from the top face and including several different colored lighting elements that are used to display an operating status of the dual chambers (1120, 1150).

Reaction Chamber

Referring now to FIGS. 12-17 a preferred gas deposition chamber assembly (3000) according to a second embodiment of the present invention is shown in various views with like elements having the same reference number. The chamber (3000) is shown in front isometric view in FIG. 12, in rear isometric view in FIG. 13 and in section view with the section A-A being shown in FIG. 14. As best viewed in FIGS. 14 and 17, the chamber assembly (3000) comprises an outer wall assembly (8000) surrounding an outer volume (3070), a removable liner (6000), shown in isometric view in FIG. 14, for installing into the outer volume (3070) through a second outer aperture, (8020), passing through a back wall of the outer wall assembly (8000). The chamber assembly (3000) further includes an input plenum (3150) and input port assembly (3230) for delivering gas reactants, precursors and inert gases, generally source material into the reaction chamber through a right side wall (8030) and an exit or output plenum (3250) and exit port assembly (3310) for removing an outflow of gases from the reaction chamber through a left side wall (8040).

The outer wall assembly (8000) generally encloses an oven structure and the removable liner (6000) generally encloses a reaction chamber (3125) and provides a substrate support surface (3350) horizontally disposed therein. The removable liner (6000) as well as plenum liners (7015) and (7080) cooperate to substantially prevent reactants from reacting with inside surfaces of the outer wall assembly (8000). Each of the removable liner (6000), plenum liners (7015) and (7080), input and output plenums (3150) and (3250), plus a removable inner panel on the access door, detailed above, are removable from the chamber assembly (3000) when they become contaminated by reactants or reactant byproducts to be replaced and each may be cleanable for reuse or disposable after one use. Moreover, each may be fabricated with bead blasted internal surfaces to prevent flaking or cracking of the build up of thin film layers that may form thereon between cleaning cycles.

The outer wall assembly (8000) comprises a plurality of outer walls formed by opposing top and bottom rectangular outer walls (8050) and (8060) attached to opposing left and right rectangular outer walls (8040) and (8030) for enclosing an outer volume (3070). As best viewed in FIG. 13, a back outer wall comprises a removable back panel (3050) which includes a back perimeter flange (3060) for attaching and gas sealing the back panel (3050) to a back face of each of the top, bottom, left and right outer walls. The back wall includes the second outer aperture (8020) for receiving the removable liner (6000) there through. The second outer aperture (8020) passes through the back outer wall or the second outer aperture (8020) may be formed by back inside edges of each of the top bottom and side outer walls. The second outer aperture (8020) provides back access to the outer volume (3070) for installing the removable liner (6000), shown in isometric view in FIG. 15, therein. The back panel may also attach to the removable liner (6000) before or after installing the removable liner (6000). The back panel (3050) also includes at least one rectangular o-ring disposed between the back panel and the back face of each of the top, bottom, left and right outer walls surrounding the second outer aperture (8020) to gas seal the outer volume (3070). In addition, if the removable liner includes a back aperture (6090), a second rectangular o-ring seal may be included between the back panel and liner back wall (6040) surrounding the back aperture (6090) to gas seal the reaction chamber. Accordingly, the back panel (3050) may also include eye bolts (3360), or the like, attached thereto, suitable for attaching to a lifting device in order to support the back panel and attached removable liner (6000) from above during installation and removal. An outer aperture (8010), passes through a front wall of the outer wall assembly (8000) to provide access to the outer volume (3070). Substrates to be coated are inserted into the removable liner (6000) through the outer aperture (8010). The removable liner (6000) includes a chamber aperture (6030) that substantially co-aligns with the front outer aperture (8010) when the removable liner is installed in the outer volume (3070).

The outer wall assembly (8000) encloses the outer volume (3070) with top and bottom (8050) and (80600) and left and right (8040) and (8030) walls. In the present example, the outer volume (3070) has rectangular cross-sections in a horizontal and a vertical plane. The rectangular outer aperture (8010) passes through a front wall of the outer wall assembly (8000) or is formed by front inside edges of the top, bottom and side walls of the outer wall assembly (8000). The outer aperture (8010) provides front access into the reaction chamber (3125) for inserting and removing substrates into the reaction chamber (3125) through the chamber aperture (6030). The second outer aperture (8020) passes through a back wall of the outer wall assembly or is formed by back inside edges of the top, bottom and side walls of the outer wall assembly and is provided to receive the removable liner (6000) into the outer volume there through. The second outer aperture (8020) is gas sealed by the back panel (3050). This embodiment is particularly preferred when chamber assembly front face (1180) interfaces with a clean room wall or the like and substrates installed into the reaction chamber are installed into the reaction chamber through the open access door, described below, from the clean room. In this case it would not be acceptable to install or remove the removable liner (6000) through the front face (1180) because access to the front face is from inside the clean room. Instead, the second embodiment provides access for installing the removable liner through the second outer aperture (8020). However, in some configurations the removable liner can be installed and removed from either or the front outer aperture (8010) or the back or second outer aperture (8020) as may be required.

A movable access door (3080) is movably supported with respect to a support structure (3090) which is fixedly attached to the bottom outer wall (8060). A door actuator (3100) is disposed between the support structure (3090) and the access door (3080) to guide and transport the movable access door along a vertical axis. In a down position, the access door exposes the outer aperture (8010) to provide access the outer volume (3070) and further exposes the chamber aperture (6030) that passes through a front face of the reaction chamber (3125) enclosed by the removable liner (6000). In an up position, the access door (3080) closes and gas seals both the outer aperture (8010) and the chamber aperture (6030) during coating cycles. As described above in the first embodiment, an outer rectangular o-ring, not shown in the second embodiment, is engaged with a rectangular groove formed in the inner door panel facing the reaction chamber to gas seal the outer volume (3070). The outer rectangular o-ring is disposed between the inner door panel and a front face of each of the top, bottom, left and right outer walls of the outer wall assembly (8000). Similarly, an inner rectangular o-ring not shown in the second embodiment, is engaged with a rectangular groove formed in the inner door panel facing the reaction chamber to gas seal the outer volume (3070) and disposed between the inner door panel and a front face of the removable liner to gas seal the reaction chamber.

Generally, the outer wall assembly (8000) comprises an oven structure that includes or may include resistive heating elements, or the like, (3110) disposed on or in grooves formed in external surfaces of all or some of the outer walls. Alternately, according to an advantage of the present invention, the heating elements (3110) may be disposed on or in grooves formed on internal surfaces of some or all of the outer walls because the removable liner prevents the internal surfaces of the outer walls and any heating elements disposed thereon from being contaminated by reactants. Otherwise, the heating elements (3110) can be disposed inside some or all of the outer walls such as by being sandwiched between opposing outer wall portions. The heating elements (3110) heat the outer wall assembly (8000) to a desired temperature and maintain the outer wall assembly at the desired temperature over prolonged periods of use. In addition, solid substrates that are being coated in the reaction chamber are heated to a desired reaction temperature after they have been installed into the reaction chamber, e.g. ranging from 85 to about 500° C., and or the solid substrates may be preheated before being inserted into the reaction chamber to reduce substrate heating times. Additionally, separately controllable heating elements may be disposed proximate to or assembled to substrate support trays to more directly and quickly heat substrates to a desired reaction temperature. Accordingly, the chamber assembly (3000) includes temperature sensors and one or more controllers for controlling the operation of the heating elements to achieve and maintain desired operating temperatures. Alternately, other heating means including heating elements disposed external to the outer wall assembly (8000) are usable without deviating from the present invention. In still further embodiments, the chamber assembly (3000) may not require heating elements or may instead include cooling elements to achieve desired reaction temperatures without deviating from the present invention.

When heating elements are disposed outside the outer volume (3070) it is desirable to direct thermal energy into the outer volume (3070). Accordingly, the outer walls (8030, 8040, 8050 and 8060) preferably comprise a material having a high thermal conductivity in order to provide a conductive path between the heating elements (3110) and the outer volume (3070). In addition, it is desirable that the outer wall material meet its structural and thermal property characteristics over the range of operating temperatures that the chamber assembly (3000) is expected to be subjected to.

Ideally, the outer wall assembly (8000) including the back panel (3050) and access door (3080) comprises a substantially gas tight structure when the access door (3080) in a closed position. In particular, the outer volume (3070) may be pumped to low medium or high vacuum pressures ranging from less than 760 to 10 microtorr to remove contaminants, reactants, and reactant byproducts from the chamber assembly. Accordingly, it is desirable to join the outer walls (8030, 8040, 8050, and 8060) with welded seams to prevent gas leaks and to configure any ports and fittings associated with the ports that pass through the outer walls with gas tight gaskets and the like as are generally used in vacuum or gas tight chambers.

In the present example, the preferred material for constructing the outer walls (8030, 8040, 8050, 8060)) is aluminum and particularly 6061 aluminum, which has good weldability, an acceptable thermal conductivity of approximately 167 W/m-K or 1160 BTU-in/hr-ft$^2$-° F., and a melting temperature of approximately 600° C. or 1150° F. Alternately, any weldable aluminum and other weldable metals can be used without deviating from the present invention. Preferably, the outer walls (8030, 8040, 8050, 8060)) comprise sheet or plate stock, folded, formed, machined, welded and fastened together as required to enclose the outer volume (3070) with gas tight seams and to provide the desired structural and thermal performance characteristics. Moreover, one or more of the outer walls (8030, 8040, 8050, 8060) may be made thicker than required to perform structurally in order to provide a heat sink suitable for maintaining the outer wall assembly (8000) at a desired operating temperature and allow quick reheating e.g. after the access door has been opened and new substrates have been added for coating. In the preferred embodiment, a layer of thermal insulation is disposed over the external surfaces of the outer walls (8030, 8040, 8050, and 8060) and back panel (3050) as well as in the access door (3080) to reduce thermal radiation to the air surrounding the outer wall assembly.

Input and Output Plenums

Figure 12:
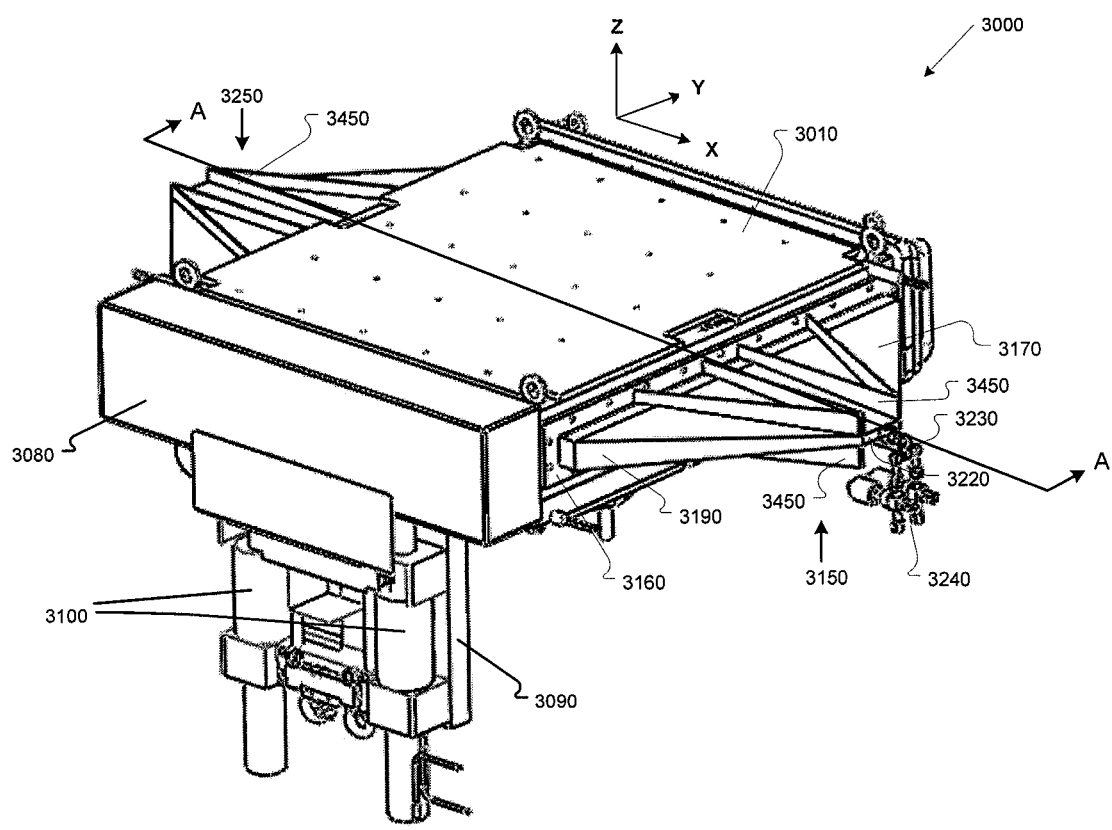
FIG. 12 depicts a front isometric front view of a gas deposition chamber assembly according to an embodiment of the invention.
Figure 13:
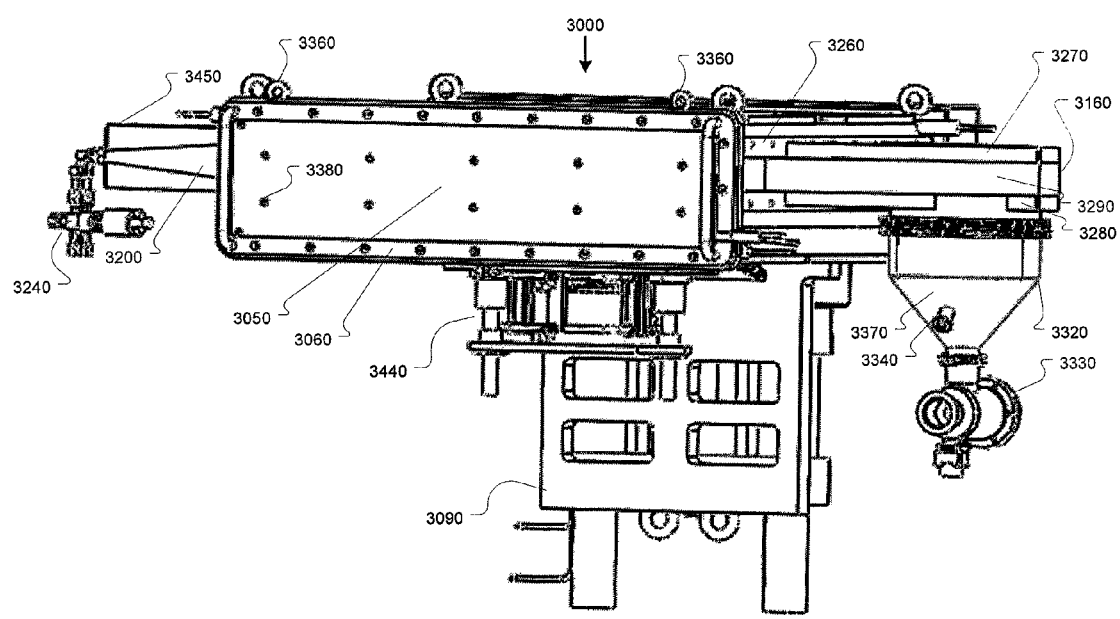
FIG. 13 depicts a back isometric back view of a gas deposition chamber assembly according to an embodiment of the invention.
Figure 14:
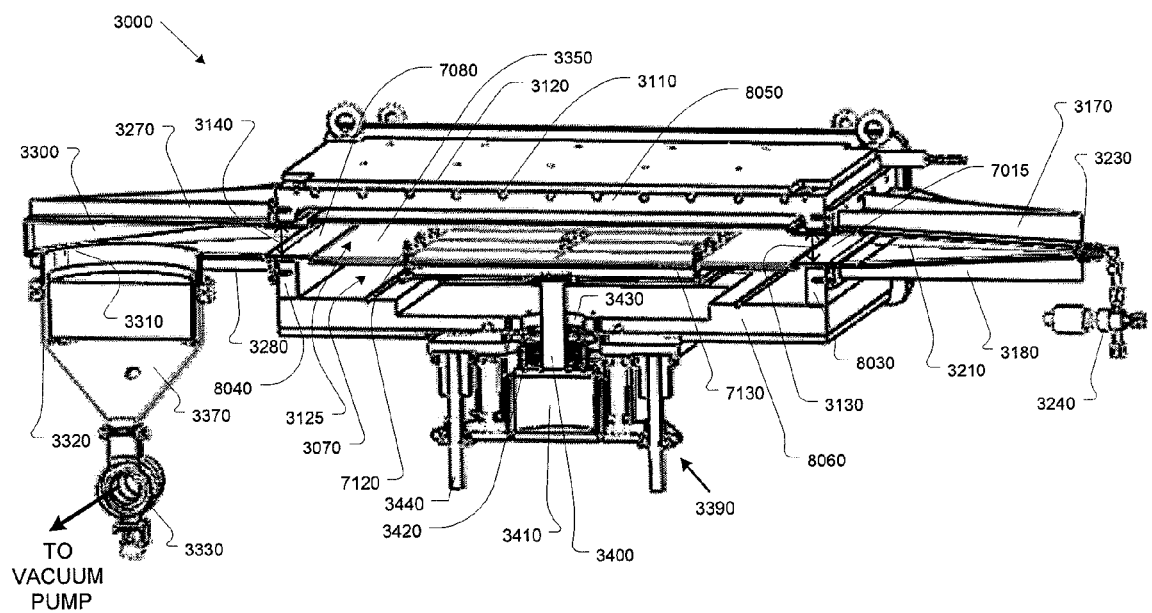
FIG. 14 depicts an isometric view of showing section A-A taken through a gas deposition chamber assembly according to an embodiment of the invention.
Figure 17:
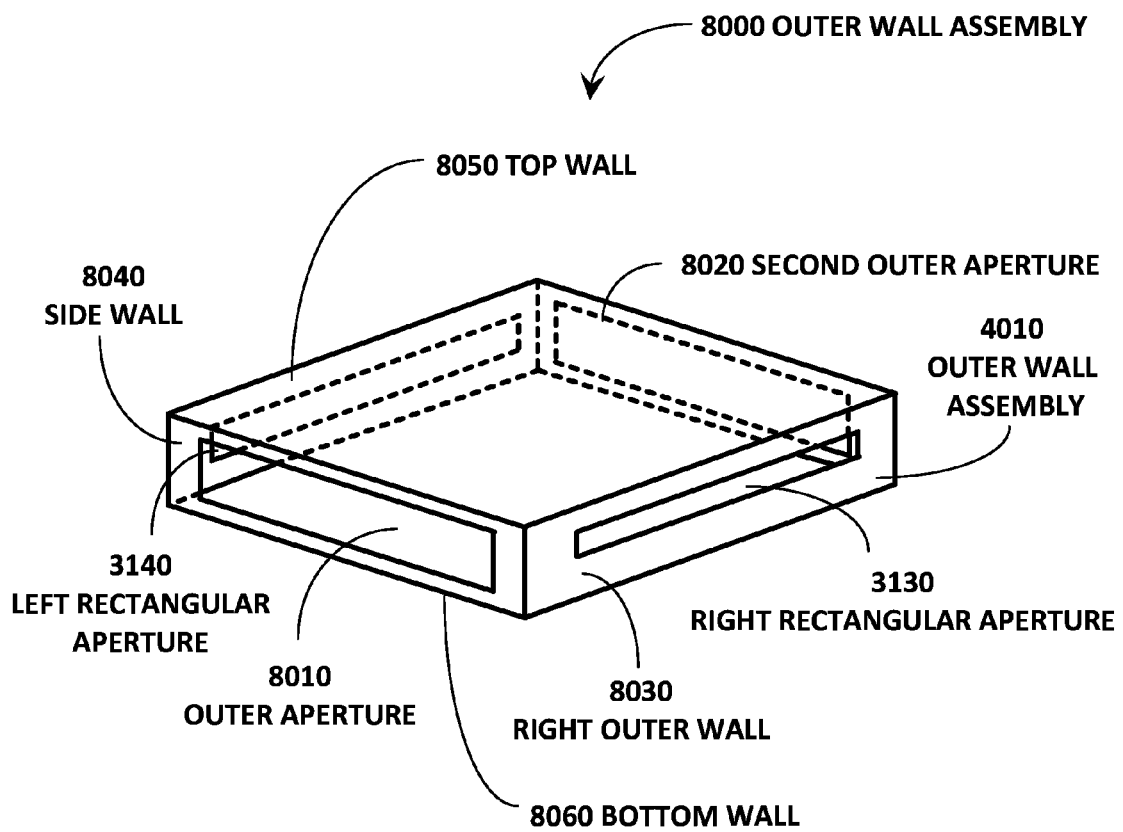
FIG. 17 depicts an isometric view of a second exemplary outer wall assembly according to the present invention.

Referring now to FIGS. 12, 14 and 17, the right outer wall (8030) extends along a Y-axis and is formed with a right rectangular through aperture (3130) passing there through to the outer volume (3070). The Y-axis dimension and position of the right rectangular through aperture (3130) substantially corresponds with the Y-axis position and dimension of a substrate positioned inside the reaction chamber for coating. An input plenum (3150) is attached to the right outer wall (8030) by an input plenum flange (3160). The input plenum flange (3160) forms a gas tight seal with the right outer wall (8030). The bolt pattern and sealing elements of the input plenum flange (3160) and the right outer wall (8030) are modular to allow a user to reconfigure the chamber assembly (3000) with various input plenum configurations or to bolt other elements to the right side outer wall (8030) as may be required, including an output plenum to reverse the flow direction of the chamber assembly.

In the preferred embodiment the input plenum (3150) comprises opposing substantially triangular shaped top and bottom input plenum walls (3170) and (3180) attached to opposing substantially trapezoid shaped input plenum side walls (3190) and (3200). The top and bottom input plenum walls (3170) and (3180) and the side input plenum walls (3190) and (3200) combine to enclose a substantially triangular shaped input plenum chamber (3210). A short input plenum end wall (3220) attaches to each of the top and bottom input plenum walls (3170) and (3180) and the side input plenum walls (3190) and (3200) to truncate an apex of the triangular shaped input plenum chamber (3210). A gas input port (3230) passes through the input plenum end wall (3220) and a gas supply module (3240) delivers gases through the input port (3230) into the input plenum chamber (3210) near the truncated triangular apex. As best viewed in the isometric views of FIGS. 12 and 13, the width or Y-axis dimension of the triangular shaped input plenum chamber (3210) expands linearly from it apex to a base dimension of the triangular volume enclosed thereby. Accordingly, the volume of the input plenum expands from a small volume near the input port (3230) to a larger volume at the plenum flange (3160) and the height or Z-axis dimension of the triangular shaped input plenum chamber (3210) also expands linearly from the input port (3230) to the plenum flange (3160). Accordingly, gases delivered through the input port (3230) expand to substantially fill the volume of the triangular shaped input plenum chamber (3210) and this causes gas flowing through the input plenum chamber (3210) to expand to substantially fill the right rectangular through aperture (3130) while also reducing the gas pressure and velocity in proportion to distance from the input port (3230). Accordingly, the shape of the input plenum chamber (3210) helps to substantially distribute input gas flow over the entire wide of the fill the right rectangular through aperture (3130) which has a width matched to a longitudinal length or Y-axis dimension of a substrate being coated. The triangular shaped input plenum chamber (3210) also helps to prevent turbulent gas flow and eddy currents from being generated inside the input plenum chamber (3210) and contributes to producing a less turbulent gas flow through the right rectangular through aperture (3130) and, as will be described in detail below, over the top surface of a substrate being coated.

The left outer wall (8040) extends along the Y-axis opposed to the right outer wall (8030) and is formed with a left rectangular through aperture (3140) passing through the left outer wall (8040) to the outer volume (3070). The Y-axis dimension and position of the left rectangular through aperture (3140) are matched with the Y-axis position and dimension of the right rectangular through aperture (3130) and to a substrate positioned inside the reaction chamber for coating. Accordingly, gas enters the outer volume (3070) through the right rectangular aperture (3130), flows over the top surface of a substrate supported inside the hollow rectangular chamber (3070) for coating and exits the hollow rectangular chamber (3070) through the left rectangular aperture (3140). An output plenum (3250) is attached to the left outer wall (8040) by an output plenum flange (3260). The output plenum flange (3260) forms a gas seal with the left outer wall (8040). The bolt pattern and sealing elements of the output plenum flange (3260) and the left outer wall (8040) are modular and matched to the bolt pattern of the input plenum (3150) and right side wall (8030) to allow a user to reconfigure the chamber assembly (3000) with various output plenum configurations, as may be required, or to bolt other elements to the left side outer wall (8040) as may be required, including an input plenum as required to reverse the flow direction of the chamber assembly.

In the preferred embodiment the output plenum (3250) comprises opposing substantially triangular shaped top and bottom output plenum walls (3270) and (3280), attached to opposing substantially rectangular output plenum side walls (3290), only one is shown. The triangular shaped top and bottom output plenum walls (3270) and (3280) and the opposing rectangular output plenum side walls (3290), only one shown, combine to enclose a substantially triangular shaped output plenum chamber (3300). A short end wall, not shown, attaches to each of the top and bottom walls (3270) and (3280) and the opposing rectangular side walls (3290), the other not shown, to truncate an apex of the triangular shaped output plenum chamber (3300). A base of the triangular shaped output plenum chamber is open to the left rectangular aperture (3140). An exit port (3310) passes through the bottom output plenum wall (3280) and an exit port module (3320) attached to the exit port (3310) is in fluidic communication with a vacuum pump, not shown. Alternately, the exit port (3310) can be formed in the top output plenum wall (3270).

The exit port module (3320) includes a cone shaped passage (3370) terminated by a stop valve (3330) for closing the exit port (3310). A vacuum pressure gauge (3340) is disposed in the cone shaped passage (3370) for sensing gas pressure in the exit port module (3320). The vacuum pump, not shown, is operated to draw gas through the exit port module (3320) to evacuate the chamber assembly (3000) by pumping gas out of the chamber assembly (3000). As best viewed in the section view of FIG. 14, the volume of the triangular shaped output plenum chamber (3300) is smaller at the exit port (3310) than it is at its base at the output plenum flange (3260) and the triangular shape of the output plenum chamber (3300) draws gas exiting from the reaction chamber substantially uniformly across the entire left rectangular aperture (3140) to draw gas even across the entire y-Axis dimension of a substrate supported in the reaction chamber. The narrowing volume of the triangular shaped output plenum also causes the velocity of gas flowing there through to increase as it approaches the exit port (3310). The increase in gas velocity proximate to the exit port decreases the cycle time required to purge or evacuate the reaction chamber.

Each of the input and output plenums (3150) and (3250) include structural stiffening ribs (3450) disposed and welded on the top and bottom plenum walls (3170, 3180, 3270, 3280) to prevent the top and bottom plenum walls from buckling under the substantial pressure gradient between a lower pressure inside each plenum and atmospheric external pressure. In addition, each of the input and output plenums (3150) and (3250) is easily removable and replaceable should the plenums become contaminated by reactants or reactant byproducts flowing there through. Preferably, the input and output plenum walls are fabricated from metals, e.g. stainless steel, that are cleanable by mechanical or chemical cleaning processes such as those described above. Moreover internal surfaces of the plenums may be roughened (e.g. by shot or bead blasting) prior to use to improve reactant coating adhesion to the plenum internal surfaces and thereby prevent cracking or flaking of reactant layers between cleaning or replacement cycles.

Accordingly, each of the input and output plenums (3150) and (3250) can be removed for cleaning or swapped with an auxiliary set of clean plenums to avoid production down time. In addition, external surfaces of each of the input and output plenums (3150) and (3250) may be thermally insulated to prevent thermal losses through the plenum walls and the external surfaces may be heated by electrical heating coils disposed thereon to preheat or post heat reactants and reactant byproducts flowing there through. In addition, each plenum may include various sensors for sensing temperature, pressure, gas type, and other conditions inside or proximate to the plenums. In addition, each plenum may include internal baffles, not shown, e.g. disposed on or between internal surfaces of the top and bottom plenum walls (3170, 3180, 3270, and 3280) to more efficiently direct gas flow along desired flow paths inside the plenum.

Gas Flow

Referring now to the section AA shown in FIG. 14, gas entering the triangular input plenum chamber (3210) through the input port (3230) expands in the input plenum and flows through the right rectangular aperture (3130) with a substantially uniform gas distribution over its Y and Z Axis dimensions. The gas then flows through the reaction chamber (3125) enclosed by the removable liner (6000) and over the top surface of a substrate positioned inside the removable liner (6000) with a substantially uniform gas distribution over the Y axis dimension of the substrate. Thereafter the gas flows through the left rectangular aperture (3140) and into the triangular output plenum chamber (3300) where it is compressed in volume as it flows toward the exit port (3310). The joints or seams of the outer walls (8030, 8040, 8050, and 8060) are welded and any flanges, ports or other apertures passing through the outer walls are configured with seals and bolt patterns that are suitable for providing gas tight seals to prevent gas leakage into or out of the plenums or the outer volume. In some applications, the outer walls, the input and output plenums, the movable access door (3080), the back panel (3050) and any ports that pass through any of these elements are constructed for substantially leak proof operation in high vacuum and preferably the outer volume can be pumped down to vacuum pressures of about 10 microtorr. In addition, the gas supply module (3240) includes a controllable stop valve for closing the input port (3230) and the exit port stop valve (3330) is controllable for closing the exit port (3310) as required by various gas deposition cycles. Accordingly, the outer volume can be isolated and maintained at a vacuum pressure for an extended period as may be required. In addition, the gas supply module and the vacuum pump can be operated continuously to pass a constant gas flow through the outer volume, such as to purge all passages with an inert purge gas such as nitrogen. Otherwise the gas supply module may operate non-continuously to deliver a precise volume of a desired gas, such as a precursor gas, into the reaction chamber.

Removable Liner

Figure 15:
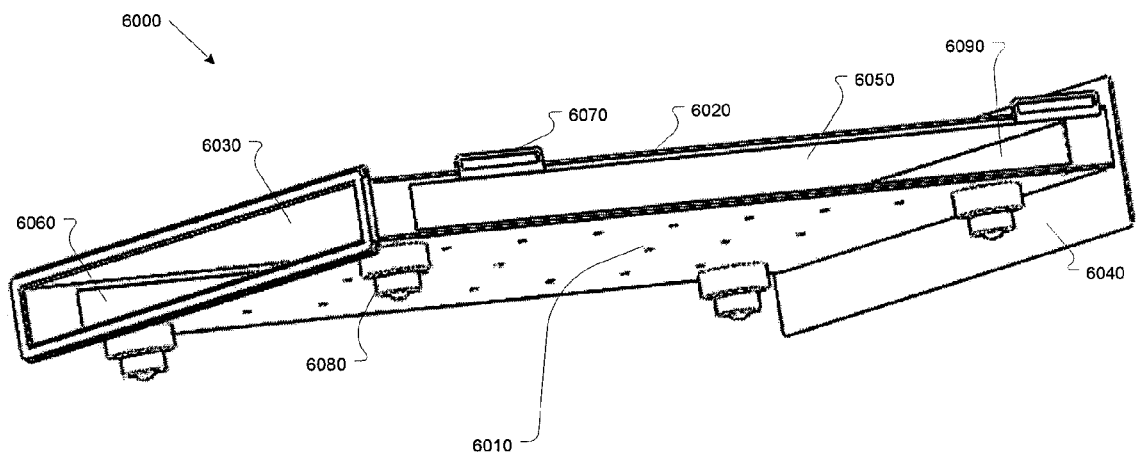
FIG. 15 depicts an isometric view of a welded chamber liner assembly according to an embodiment of the present invention.

Referring now to FIGS. 13, 14, 15 and 17, a removable liner assembly (6000) is shown in isometric view in FIG. 15. The liner assembly (6000) installs into the chamber assembly (3000) through the second outer aperture (8020) formed through the back outside wall when the back panel (3050) is removed. The back panel (3050) and the liner assembly (6000) may be assembled together using the fasteners (3380) and installed into the outer wall assembly as a unit. The liner assembly (6000) includes a bottom liner wall (6010), the top surface of which comprises a substrate support surface (3350) for supporting a substrate being coated. The liner assembly (6000) encloses the reaction chamber (3125) which supports the substrate being coated therein. The liner assembly substantially prevents reactants from contaminating internal surfaces of the outer walls (8030, 8040, 8050, and 8060) thereby preventing reactant layers from forming on inside surfaces of the outer wall assembly (8000). In other embodiments, the liner assembly (6000) may be configured to be installed and removed through the front outer aperture (8010).

The liner assembly includes a liner base wall (6010) and an opposing liner top wall (6020). The top surface of the liner base wall (6010) functions as the substrate support surface (3350) shown in FIG. 14. A liner front wall forms a rectangular aperture that serves as the chamber aperture (6030). The chamber aperture (6030) substantially co-aligns with the outer aperture (8010) passing through the front face of the outer wall assembly. A liner back wall (6040) attaches to the back panel (3050) with fasteners (3380) and includes a rectangular back aperture (6090) in order to provide back access to the reaction chamber (3125). An inside surface of the back panel (3050) opposed to the rectangular back aperture (6090) may comprise stainless steel in order to be cleanable by the mechanical or chemical cleaning methods described above. Alternately, the liner back wall (6040) may comprise a solid wall to protect the back panel (3050) from reactant contamination. The back panel (3050) is attached to the outer wall assembly by the back perimeter flange (3060). The liner assembly (6000) includes opposing side walls that each includes a side rectangular through aperture (6050) and (6060) and these side rectangular through apertures align with the left and chamber right rectangular apertures (3140) and (3130) passing through left and right outer walls (8040) and (8030) when the liner assembly (6000) is installed inside the chamber assembly (3000). All of the liner assembly walls comprise stainless steel, which is cleanable by mechanical abrasion. The liner assembly (6000) can be swapped with a clean auxiliary liner assembly when it is contaminated to allow production to continue while the contaminated liner is cleaned. Alternately, the liner assembly (6000) may be disposable after it has been contaminated. Internal surfaces of the removable liner may be roughened by bead blasting or the like to improve adhesion of thin film layers built up thereon and this prevents cracking or peeling of the built up layers. However, depending on the application, the substrate support surface is not roughened.

Because the liner assembly weighs about 120 pounds, lifting handles (6070) are provided on the liner top wall (6020) to allow the liner assembly to be supported from an over head crane or a lifting tool by straps or hooks. Similarly the back panel eye bolts (3360) can be supported by a lifting device while the liner assembly is guided into the outer wall assembly. Four rolling tooling balls (6080), or the like, are mounted on the liner base wall (6010). The rolling tooling balls (6080) contact with and roll along the bottom outer wall (8060) as the liner assembly is guided into the chamber assembly (3000) through the second outer aperture (8020). The height or Z-axis dimension of the tooling balls (6080) establishes the Z-axis position of the substrate support surface (3350) to align the substrate support surface with the left and right rectangular apertures (3140) and (3130) and to position the top surface of a substrate being coated at a desired Z-axis height with respect to gas flow in the chamber. The liner assembly back wall (6040) is formed to make mating contact with back end surface of the outer walls (8030, 8040, 8050, 8060) when the removable liner is installed to provide a thermally conductive path between the heated outer wall and the liner assembly (6000). Alternately or additionally, other surfaces of the liner assembly (6000) may be configured to make mating contact with the outer walls to provide additional thermally conductive paths between the removable liner and the outer walls.

Plenum Liners Substrate Position, Purge Gas and Lift Pins

Figure 16:
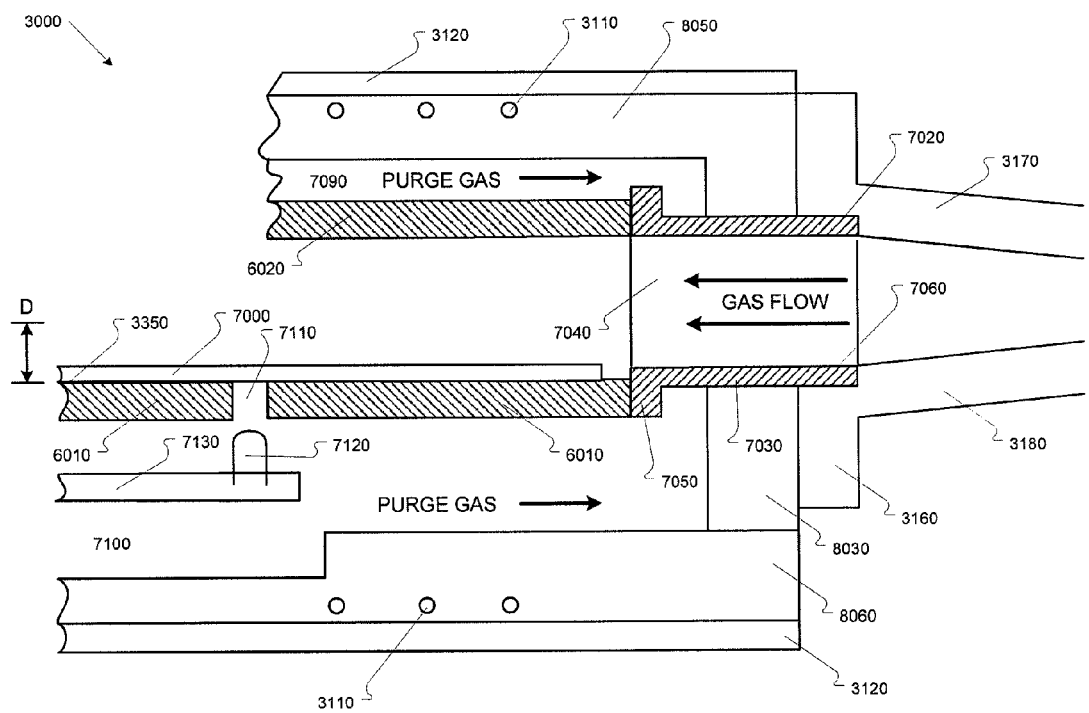
FIG. 16 depicts schematic representation of an exploded section view showing a substrate supported on the chamber liner assembly and a pair of plenum liners according to an embodiment of the present invention

Referring now to FIG. 16, an exploded section view of the right side of chamber assembly (3000) shows the top and bottom input plenum walls (3170) and (3180) and the input plenum flange (3160), the top and bottom outer walls (8050) and (8060), the electrical heaters (3110), thermal insulation layers (3120), the right outer wall (8030) and the right rectangular aperture (3130) passing there through. The bottom and top removable liner walls (6010) and (6020) are shown co-aligned with the right rectangular aperture (3130) such that gas enters the reaction chamber from the input plenum and flows over a substrate (7000) supported on the bottom liner wall (6010) substrate support surface (3350). The left side of the chamber assembly (3000) is substantially identically formed.

As is further shown in FIGS. 14 and 16, an input plenum liner (7015) comprises a rectangular tube shaped element formed by opposing top and bottom plenum liner walls (7020) and (7030) each connected to opposing back and front plenum liner walls, not shown, configured to enclose a rectangular fluid conduit (7040). The plenum liner conduit (7040) is in fluidic communication with the input plenum and with the right liner aperture (6050). The input plenum liner installs through the right rectangular aperture (3130) from inside the outer wall assembly. A right end of the plenum liner interfaces with internal surfaces of the input plenum (3170) and both elements are formed to provide a smooth interface that prevents eddy current formation as gas flow over the interface. A flange (7050) formed on the left side of the plenum liner (7030) butts up against the removable liner right side wall and the plenum liner conduit (7040) is aligned with the right liner aperture (6050) to deliver eddy free gas flow into the reaction chamber. The flange (7050) is formed on four sides of the input plenum liner for surrounding the entire right liner aperture (6050) and gas seals the interface between the flange (7050) and the removable liner (6000). The opposite end of the input plenum liner (7015) interfaces with the input plenum (3150) and forms a gas seal therewith such that gas flows flowing out of the input chamber passes through the rectangular fluid conduit (7040) to the reaction chamber. Accordingly, the input plenum liner prevents reaction gases from contaminating the chamber right outer wall (8030) and from entering the outer volume (3070) except into the reaction chamber (3125). A top surface (7060) of the bottom plenum liner wall (7030) is disposed substantially coplanar with of a top surface of the substrate (7000). Gas exiting from the input plenum flows through the input plenum liner and over the top surface of the substrate (7000). By positioning the input plenum liner top surface (7060) coplanar with the stop surface of the substrate (7000) eddy current formation at the leading edge of the substrate (7000) is avoided. An output plenum liner (7080), shown in FIG. 14, is substantially identical to the input plenum liner described above and installs through the left rectangular aperture (3140). Both plenum liners are made of a cleanable material such as stainless steel and internal surfaces of the plenum liner conduits may be bead blasted to roughen the surfaces.

As best viewed in FIG. 16 open area of the outer volume (3070) are outside reaction chamber enclosed by the removable liner (6000). In particular, an upper volume (7090) and a lower volume (7100) extend between the removable liner (6000) and the top and bottom outer walls (8050) and (8060). The volumes (7090) and (7100) may also be fluidly connected with each other at the front and rear of the outer volume (3070). In addition, the lower volume (7100) is used to house a movable pin assembly, described below, and the lower volume (7100) is in fluidic communication with the inside of the liner assembly (6000) through pin holes (7110) that pass through the bottom liner wall (6010). To further prevent reactants from contaminating internal surfaces exposed to the upper and lower volume (7090) and (7100) the outer volume (3070) is substantially continuously purged with nitrogen or an inert gas. The purge gas is pumped into the outer volume (3070) or separately into the upper and lower volumes (7090)

and (7100) at a low positive pressure (e.g. less than about 5 pounds per square inch) such that a pressure gradient is created by the purge gas causing the outer volume to have a higher gas pressure than the reaction chamber. The pressure gradient further helps to prevent reactants from leaking into the outer volume through the removable liner, plenum liners, or plenums.

Movable Pin Assembly

Referring now to FIGS. 14 and 16 a plurality of lift pins (7120) are movably supported by a movable pin plate (7130) disposed in the lower volume (7100) between the bottom outer wall (8060) and the bottom liner wall (6010). The pin plate (7130) is a rectangular plate and the plurality of lift pins (7120) are arranged in rows and columns with each lift pin fixedly attached to the pin plate (7130) and with the top of each lift pin extending to an equal height above the movable pin plate such that the top of each lift pin (7120) forms one point of a substrate support surface. The bottom liner wall (6010) includes a plurality of through holes (7110) passing there through with one through hole (7110) corresponding with each of the plurality of lift pins (7120). When the movable pin plate (7130) is raised to a lift position, the plurality of lift pins (7120) extend through the plurality of corresponding through holes (7110) to either lift the substrate (7000) away from the substrate support surface (7110) or to position the pin tops at a height (D) above the substrate support surface (3350) for receiving a substrate (7000) on the pin tops. In particular, the height (D) corresponds to a height that allows robotic substrate handler lifting arms to be inserted into the reaction chamber between the pin tops and the substrate support surface (3350) to load a substrate (7000) onto the pin tops or to unload a substrate from the pin tops. When the movable pin plate (7130) is lowered, the pin tops are lowered below the substrate support surface (3350) such that a substrate supported on the pin tops is placed in contact with the substrate support surface (3350). Preferably, the lift pins (7120) remain engaged with the through holes (7110) when the pins are lower to limit the flow of purge gas through the holes (7110), however the pins can be lowered to a position below the bottom liner wall (6010) as shown in FIG. 16.

Referring now to FIG. 14, a pin actuator assembly (3390) is disposed outside the chamber assembly attached to an external surface of the bottom outer wall (8060). A lift post (3400) extends between a pneumatic cylinder and piston assembly (3410) and the movable pin plate (7130) by passing through a circular hole (3430) through the bottom outer wall (8060). A vacuum bellows (3420) extends from the pneumatic cylinder and piston assembly (3410) to the bottom outer wall and gas seals the circular through hole (3430). The pin actuator assembly (3390) further includes a pair of guide rods (3440) for guiding movement of the pneumatic cylinder and piston assembly (3410) and the lift post (3400). The system controller coordinates actuation of the pin actuator assembly to raise and lower the movable pin plate when the access door is open for the loading and unloading of substrates.

Referring to FIGS. 14 and 16, according to the present invention, a rectangular glass substrate to be coated is installed into the reaction chamber (3070) by lowering the movable access door (3080) and raising the movable pin plate (7130). The substrate (7000) is then inserted into the chamber by a robotic substrate handler or another insertion device and set down resting on the tops of the plurality of lift pins (7120). One dimension of the substrate (7000) is substantially centered between the input and output plenums (3150) and (3250) and the other dimension of the substrate is centered with respect to the left and right rectangular apertures (3140) and (3130). The movable pin plate (7130) is then lowered to set the substrate (7000) onto the substrate support surface (7110) and the access door (3080) is closed. The reaction chamber is then heated to raise the substrate to the gas deposition temperature and the vacuum pump is started to remove air and other contaminants from the reaction chamber which may be pumped to a low medium or high vacuum pressure. The reaction chamber also may be purged with an inert gas during the initial pump down to remove contaminants such as water vapor. When the chamber is at the desired pressure and the substrate at the desired temperature, a gas deposition recipe can begin. Generally, the recipe begins by closing the stop valve (3330) and introducing a reactant gas or vapor into the reaction chamber through the input port (3230). Alternately, the reactant can be introduced with the stop valve (3330) open and the vacuum pump operating. After the first reactant has reacted with the substrate, the reaction chamber is purged by running the vacuum pump and flushing the reaction chamber with a purge gas. The cycle is then repeated for a second reactant gas or vapor and the two reactant cycles may be repeated many thousands of times in order to build up a desired coating thickness. When substrate coating is complete, the stop valve (3330) is closed and the chamber is purged to atmosphere through the input port or another port. The movable access door (3080) is opened and the movable pin plate (7130) is raised to lift the coated substrate from the substrate support surface. The robotic substrate handler then removes the coated substrate form the chamber and installs an uncoated substrate into the chamber for the next coating cycle.

ALD System Third Embodiment

Figure 18:
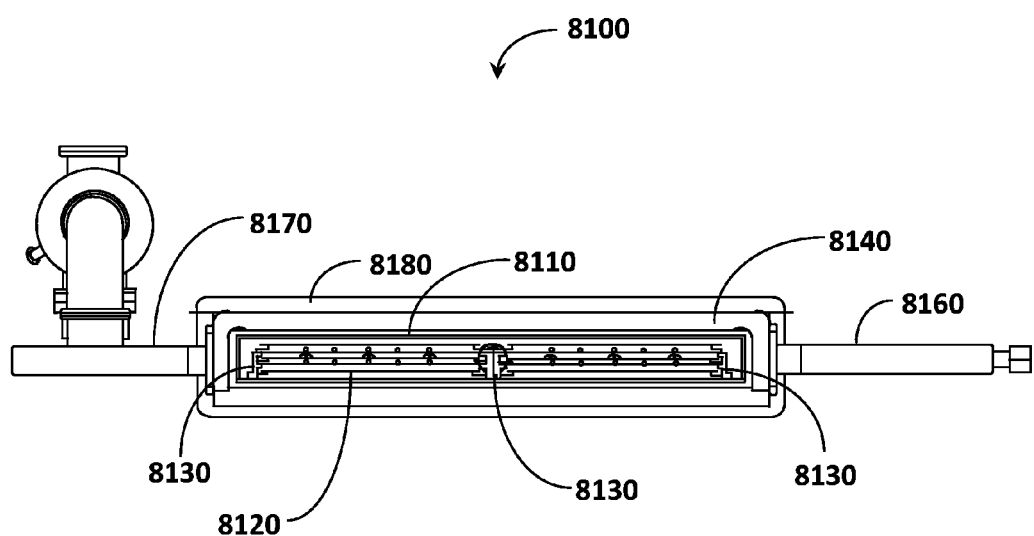
FIG. 18 depicts a front view of a third exemplary embodiment of a reaction chamber assembly configured with a removable liner and six substrate support trays according to the present invention.
Figure 19:
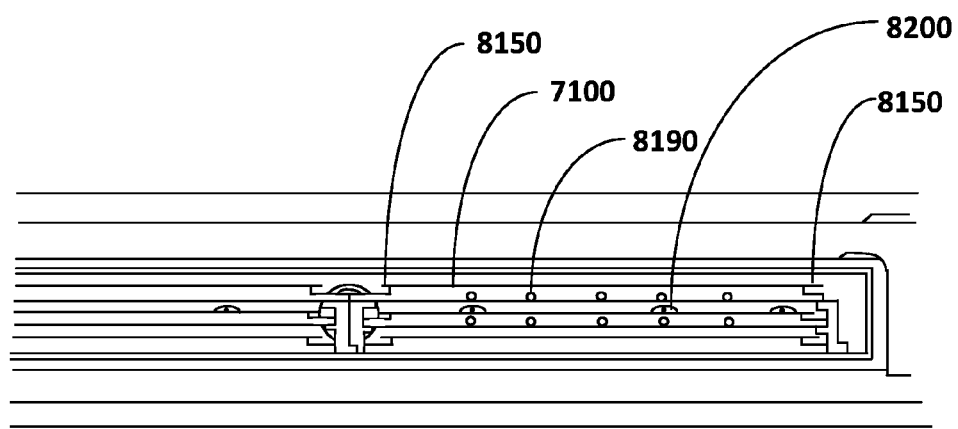
FIG. 19 depicts an exploded front view of a portion of the third exemplary embodiment of a reaction chamber assembly according to the present invention.

Referring now to FIGS. 14 and 18-19, a third embodiment of a chamber assembly (8100) according to the present invention is configured substantially like the reaction chamber (3000) described above except that the X-axis dimension of the chamber assembly (8100) is more than doubled and a removable liner (8110) is configured with six substrate trays (8120) instead on one substrate support surface. The substrate trays (8120) are supported in two stacks of three trays each with side by side substrate trays being substantially coplanar. Substrate trays (8120) are supported at each end thereof by a plurality of tray supports (8130) fixedly attached to the removable liner (8110). Each substrate tray (8120) supports a single substrate (7000) in a substantially horizontal orientation with a surface to be coated facing up.

The removable liner (8110) houses a reaction chamber (8140) suitable for batch coating six rectangular substrates (7000) supported on horizontal substrate trays (8120). The substrate trays are sized to allow the substrates (7000) to overhang the substrate trays (8120) at each end so that opposing edges of the substrates (8150) can be used to pick up the substrates (7000) when a substrate manipulating arm, or the like, is used to pick up and lower substrates using the overhanging edges (8150). Otherwise, the chamber assembly (8100) includes an input plenum (8160) an exit plenum (8170) and an outer wall assembly (8180) all substantially configured like the corresponding elements of the chamber assembly (3000) described above except that the chamber assembly (8100) does not include plenum liners as described above.

Accordingly, reactant gas enters the reaction chamber assembly (8100) from the input plenum (8160), flows through the reaction chamber (8140) and over all six substrates before exiting from the reaction chamber (8140) through the exit plenum (8170). Preferably, the chamber assembly (8100) is configured to coat six GEN 4.5 glass substrates, each having rectangular dimensions of 920 mm wide by 730 mm long in a single coating run or batch. More specifically, the GEN 4.5 glass substrates are supported with the 920 mm dimension disposed along the reaction chamber X-axis.

Each substrate tray (8120) includes a resistive heating element (8190) disposed in grooves along its bottom surface, or otherwise disposed proximate to the substrate tray (8120) for individually heating each substrate tray (8120) and the substrate (7000) supported thereby. Preferably, each substrate tray (8120) comprises ALPASE K100-S which is an aluminum plate material specifically designed for vacuum applications and provides a relatively high thermal conductivity (e.g. 812 BTU-in/hr-ft$^2$-° F.) to quickly and uniformly conduct thermal energy form the heating elements (8190) to the substrates (7000). Alternately, the substrate trays (8120) can be fabricated from stainless steel so that the trays can be cleaned by mechanical abrasion and reused.

The chamber assembly (8100) also includes an electrical connector (8200) associated with each of the substrate trays (8120) and disposed inside the reaction chamber (8140) along a back wall thereof. The electrical connectors (8200) provide power to the resistive heating element (8190) associated with each substrate tray (8120) and may be configured such that the resistive heating element connects to the electrical connector (8200) when each substrate tray (8120) is mounted in its operating position.

It will also be recognized by those skilled in the art that, while the invention has been described above in terms of preferred embodiments, it is not limited thereto. Various features and aspects of the above described invention may be used individually or jointly. Further, although the invention has been described in the context of its implementation in a particular environment, and for particular applications, those skilled in the art will recognize that its usefulness is not limited thereto and that the present invention can be beneficially utilized in any number of environments and implementations where it is desirable to coat objects with thin layers of material. Accordingly, the claims set forth below should be construed in view of the full breadth and spirit of the invention as disclosed herein.

What is claimed:

1. A reaction chamber assembly comprising:
    an outer wall assembly for enclosing an outer volume comprising outer walls and an outer aperture passing through one of the outer walls to the outer volume;
    a removable liner formed as a substantially unitary structure for enclosing a reaction chamber comprising liner walls and a chamber aperture passing through one of the liner walls to the reaction chamber wherein the liner walls are configured to substantially contain reactants inside the reaction chamber and wherein the assembled removable liner is configured to be entirely installed into and removed from the outer volume through the outer aperture,
    wherein the outer aperture passes through a front wall of the outer wall assembly and the chamber aperture passes through a front wall of the removable liner such that the removable liner is received into the outer volume through the front wall of the outer wall assembly and substrates to be coated are received into the reaction chamber through the front wall of the removable liner.

2. The reaction chamber assembly of claim 1 wherein the outer volume comprises an oven chamber.

3. The reaction chamber assembly of claim 2 wherein the outer walls are formed and assembled to provide a substantially gas tight outer volume.

4. The reaction chamber assembly of claim 3 wherein the outer walls comprise metal.

5. The reaction chamber assembly of claim 4 wherein the outer walls are substantially formed from 6000 series aluminum.

6. The reaction chamber assembly of claim 1 wherein the liner walls are formed from a material that permits reactants deposited thereon as thin film layers to be removed by a cleaning process.

7. The reaction chamber assembly of claim 6 wherein the liner walls are formed from a metal having hardness greater than HB 150.

8. The reaction chamber assembly of claim 6 wherein the liner walls are formed from 300 series stainless steel.

9. The reaction chamber assembly of claim 1 wherein portions of the outer walls and the liner walls are in mating contact when the removable liner is installed inside the outer volume.

10. The reaction chamber assembly of claim 1 wherein portions of inside surfaces of the outer walls and outside surfaces of the liner walls are separated by a clearance gap volume further comprising an input port passing through the outer walls to deliver a flow of gas into the clearance gap volume wherein the flow of gas maintains a substantially positive pressure gradient between the outer volume and the reaction chamber.

11. The reaction chamber assembly of claim 10 further comprising a venting element in fluid communication with the clearance gap volume for venting excessive gas pressure in the clearance gap volume.

12. The reaction chamber assembly of claim 10 further comprising a pump in fluid communication with the clearance gap volume to withdraw gas from the clearance gap volume while still mainlining the substantially positive pressure gradient between the clearance gap volume and the reaction chamber.

13. The reaction chamber assembly of claim 1 wherein:
    the front wall of the outer wall assembly is formed with a recess surrounding the outer aperture;
    the front wall of the removable liner is formed with a flange surrounding the chamber aperture; and,
    at least one surface of the flange is in mating contact with at least one surface of the recess when the removable liner is installed in the outer volume.

14. The reaction chamber assembly of claim 1:
    wherein the outer aperture passes through a front wall of the outer wall assembly and the chamber aperture passes through a front wall of the removable liner;
    further comprising a second outer aperture passing through a back wall of the outer wall assembly;
    wherein the removable liner is received into the outer volume through the second outer aperture; and,
    wherein substrates to be coated are received into the reaction chamber through the outer aperture passing through the front wall of the outer wall assembly and through the chamber aperture passing through the front wall of the removable liner.

15. The reaction chamber assembly of claim 1 further comprising a substrate support tray horizontally supported within the removable liner.

16. The reaction chamber assembly of claim 15 wherein the substrate support tray comprises a plurality of substantially identical substrate support trays horizontally supported within the removable liner at a different vertical heights.

17. The reaction chamber assembly of claim 16 wherein the substantially identical substrate support trays each have dimensions suitable for supporting a single rectangular substrate with rectangular substrate dimensions defined by one of the GEN 1 (300×400 mm) through the GEN 7 substrate dimension standards (2160×2460 mm).

18. The reaction chamber assembly of claim 1 further comprising an access door movably disposed with respect to each of the outer wall assembly and the removable liner for providing access to the removable liner through the chamber aperture when the access door is in an open position and for closing and gas sealing each of the outer aperture and the chamber aperture when the access door is in a closed position.

19. The reaction chamber of claim 18 wherein the access door comprises a removable inner door panel positioned to substantially contain reactants inside the reaction chamber and formed from a material that permits reactants deposited thereon to be removed there from by a cleaning process.

20. The reaction chamber assembly of claim 19 wherein the inner door panel is formed from a metal having hardness greater than HB 150.

21. The reaction chamber assembly of claim 20 wherein the inner door panel is formed from 300 series stainless steel.

22. The reaction chamber assembly of claim 20 further comprising heating elements disposed in the access door for heating the reaction chamber through the inner door panel.

23. The reaction chamber assembly of claim 1 further comprising:
an input plenum disposed between reactant gas sources and the removable liner comprising input plenum walls for enclosing an input plenum volume;
an input port passing through one of the input plenum walls; and
wherein the input plenum volume is shaped to allow gas entering into the input plenum volume through the input port to expand over the full transverse width of the removable liner before the gas exiting from the input plenum volume enters into the removable liner.

24. The reaction chamber assembly of claim 23 wherein the input plenum is integrally formed with the removable liner.

25. The reaction chamber assembly of claim 24 wherein the input plenum is integrally formed with a bottom liner wall of the removable liner.

26. The reaction chamber assembly of claim 23 wherein the input plenum is external to the reaction chamber further comprising an input plenum aperture extending through an outer wall and a liner wall wherein the input plenum aperture provides fluidic communication between the input plenum volume and the reaction chamber substantially over one of a longitudinal length and a transverse width of the reaction chamber.

27. The reaction chamber assembly of claim 23 further comprising:
an exit plenum disposed between a vacuum pump and the removable liner comprising exit plenum walls for enclosing an exit plenum volume;
an exit port passing through one of the exit plenum walls; and,
wherein the exit plenum volume is shaped to allow gas to be drawn into the exit plenum volume substantially over one of a longitudinal length and a transverse width of the removable liner and to reduce a volume of the gas being drawn into the exit plenum volume before the gas being drawn in exits through the exit port.

28. The reaction chamber of claim 27 wherein each of the input plenum and the exit plenum are formed from a material that permits reactants deposited thereon as thin film layers to be removed by a cleaning process.

29. The reaction chamber assembly of claim 27 further comprising a trap disposed between the exit plenum and a vacuum pump for reacting with and substantially removing any reactants remaining in the gas exiting through the exit port.

30. The reaction chamber assembly of claim 27 wherein the exit plenum is integrally formed with the removable liner.

31. The reaction chamber assembly of claim 27 wherein the exit plenum is external to the reaction chamber further comprising an exit plenum aperture extending through an outer wall and a liner wall wherein the exit plenum aperture provides fluidic communication between the exit plenum volume and the removable liner substantially over one of a longitudinal length and a transverse width of the removable liner.

32. The reaction chamber assembly of claim 1 wherein the outer wall assembly comprises a substantially gas tight structure comprising substantially opposing and parallel top and bottom rectangular outer walls each joined together with edges of substantially opposing and parallel left and right rectangular outer walls which are all joined together with edges of substantially opposing and parallel front and back outer walls.

33. The reaction chamber assembly of claim 32:
wherein the outer aperture comprises a rectangular aperture passing through the front outer wall;
wherein the chamber aperture comprises a rectangular aperture passing through a front liner wall;
wherein the removable liner is configured to be installed into and removed from the outer volume through the rectangular aperture passing through the front outer wall; and,
wherein substrates are inserted into and removed from the removable liner through each of the front outer wall and the front liner wall.

34. The reaction chamber assembly of claim 32:
wherein the outer aperture comprises a rectangular aperture passing through the front outer wall;
wherein the chamber aperture comprises a rectangular aperture passing through a front liner wall;
further comprising a second rectangular aperture passing through the back outer wall;
wherein the removable liner is configured to be installed into and removed from the outer volume through the second rectangular aperture passing through the back outer wall; and,
wherein substrates are inserted into and removed from the removable liner through each of the front outer wall and the front liner wall.

35. The reaction chamber assembly of claim 1 wherein the removable liner comprises a substantially gas tight shell structure sized to fit into the outer wall assembly when installed fully assembled through the outer aperture comprising substantially opposing and parallel top and bottom rectangular liner walls each joined together with edges of substantially opposing and parallel left and right rectangular liner walls which all joint together with edges of substantially opposing and parallel front and back liner walls.

36. The reaction chamber assembly of claim 35 wherein the chamber aperture comprises a rectangular aperture passing through a front liner wall, and is not formed by edges of the top bottom left and right liner walls.

37. The reaction chamber assembly of claim 1 further comprising interlocking elements disposed between the outer wall assembly and the removable liner for guiding the removable liner into and out of an operating position.

38. The reaction chamber assembly of claim 37 wherein the interlocking elements hold the removable liner in the operating position without fasteners.

39. The reaction chamber assembly of claim 13 wherein an outside surface of the flange is flush with an outside surface of the front wall when the removable liner is installed in the outer volume.

40. The reaction chamber assembly of claim 1 wherein the liner is substantially a single piece of material.

41. The reaction chamber assembly of claim 15 wherein the liner is substantially a single piece of material.

42. The reaction chamber assembly of claim 15 wherein the liner is a single piece of material.

43. The reaction chamber assembly of claim 1 wherein the reaction chamber formed by the removable liner is fully enclosed within the outer volume formed by the outer wall assembly.

44. A reaction chamber assembly comprising:
an outer wall assembly for enclosing an outer volume comprising outer walls and an outer aperture passing through one of the outer walls to the outer volume;
a removable liner formed as a substantially unitary structure for enclosing a reaction chamber comprising liner walls and a chamber aperture passing through one of the liner walls to the reaction chamber wherein the liner walls are configured to substantially contain reactants inside the reaction chamber and wherein the assembled removable liner is configured to be entirely installed into and removed from the outer volume through the outer aperture; and
one of an input port assembly and an input plenum for delivering the reactants into the reaction chamber, wherein the reactants pass through one of the outer walls and through one of the inner walls.

45. A reaction chamber assembly comprising:
an outer wall assembly for enclosing an outer volume comprising outer walls and an outer aperture passing through one of the outer walls to the outer volume;
a removable liner formed as a substantially unitary structure for enclosing a reaction chamber comprising liner walls and a chamber aperture passing through one of the liner walls to the reaction chamber wherein the liner walls are configured to substantially contain reactants inside the reaction chamber and wherein the assembled removable liner is configured to be entirely installed into and removed from the outer volume through the outer aperture; and
one of an exit port assembly and an output plenum for removing gases from the reaction chamber wherein the gasses pass through one of the outer walls and through one of the inner walls.

46. The reaction chamber of claim 1 wherein the removable liner is configured and positioned to prevent reactants from contaminating internal walls of the outer chamber.

* * * * *